(12) United States Patent
Gilchrist

(10) Patent No.: US 11,201,073 B2
(45) Date of Patent: Dec. 14, 2021

(54) SUBSTRATE TRANSPORT APPARATUS

(71) Applicant: Brooks Automation, Inc., Chelmsford, MA (US)

(72) Inventor: Ulysses Gilchrist, Reading, MA (US)

(73) Assignee: Brooks Automation, Inc, Chelmsford, MA (US)

( * ) Notice: Subject to any disclaimer, the term of this patent is extended or adjusted under 35 U.S.C. 154(b) by 0 days.

(21) Appl. No.: 14/469,260

(22) Filed: Aug. 26, 2014

(65) Prior Publication Data

US 2015/0128749 A1  May 14, 2015

Related U.S. Application Data

(60) Provisional application No. 61/869,870, filed on Aug. 26, 2013.

(51) Int. Cl.
*H01L 21/67* (2006.01)
*H01L 21/677* (2006.01)
*B25J 9/04* (2006.01)
*B25J 18/04* (2006.01)

(52) U.S. Cl.
CPC ........ *H01L 21/67742* (2013.01); *B25J 9/042* (2013.01); *B25J 18/04* (2013.01); *G05B 2219/40301* (2013.01); *Y10T 74/20323* (2015.01)

(58) Field of Classification Search
CPC ............................ Y10T 74/20323; F16G 5/16
USPC ......................................... 901/21; 74/940.04
See application file for complete search history.

(56) References Cited

U.S. PATENT DOCUMENTS

| 4,619,575 A | 10/1986 | Summa et al. |
| 5,064,340 A | 11/1991 | Genov et al. |
| 5,096,364 A | 3/1992 | Messer et al. |
| 5,180,276 A | 1/1993 | Hendrickson |
| 5,183,370 A | 2/1993 | Cruz |
| 5,431,529 A | 7/1995 | Eastman et al. |

(Continued)

FOREIGN PATENT DOCUMENTS

| JP | 058151 | 4/1990 |
| JP | 03297705 | 12/1991 |

(Continued)

OTHER PUBLICATIONS

Jacob Moore, "Belt Friction", p. 4, http://adaptivemap.ma.psu.edu/websites/friction/belt_friction/beltfriction.html.*

(Continued)

*Primary Examiner* — Ronald P Jarrett
(74) *Attorney, Agent, or Firm* — Perman & Green, LLP; Colin C. Durham

(57) ABSTRACT

A substrate processing apparatus comprising a transport arm having serially connected arm links, at least one of the arm links having a predetermined arm link height, at least a first pulley and a second pulley, where the second pulley is fixed to an arm link of the serially connected arm links, and at least one torque transmission band extending longitudinally between and coupled to each of the first pulley and the second pulley, the at least one torque transmission band having a corresponding band height for the predetermined arm link height and a variable lateral thickness such that the at least one torque transmission band includes a segment of laterally increased cross section for the corresponding band height.

25 Claims, 15 Drawing Sheets

(56) References Cited

U.S. PATENT DOCUMENTS

| | | | |
|---|---|---|---|
| 5,577,879 A | 11/1996 | Eastman et al. | |
| 5,682,795 A | 11/1997 | Solomon et al. | |
| 5,702,228 A | 12/1997 | Tamai et al. | |
| 5,778,730 A | 7/1998 | Solomon et al. | |
| 5,794,487 A | 8/1998 | Solomon et al. | |
| 5,908,281 A * | 6/1999 | Kiley | B25J 9/106 414/744.5 |
| 5,954,472 A | 9/1999 | Hofmeister et al. | |
| 6,428,266 B1 * | 8/2002 | Solomon | B25J 9/042 414/744.1 |
| 7,300,373 B2 | 11/2007 | Jinno et al. | |
| 7,901,539 B2 | 3/2011 | Bluck et al. | |
| 8,293,066 B2 | 10/2012 | Bluck et al. | |
| 8,419,341 B2 | 4/2013 | Hoey et al. | |
| 2004/0266574 A1 * | 12/2004 | Jinno | A61B 17/0469 474/153 |
| 2006/0260914 A1 * | 11/2006 | Krause | B65G 49/064 198/817 |
| 2007/0089557 A1 * | 4/2007 | Solomon | A61B 19/2203 74/490.01 |
| 2008/0249651 A1 * | 10/2008 | Hosek | B25J 9/042 700/121 |
| 2010/0178146 A1 * | 7/2010 | Kremerman | B25J 9/042 414/744.5 |
| 2012/0184815 A1 | 7/2012 | Yamakaw et al. | |

FOREIGN PATENT DOCUMENTS

| | | | |
|---|---|---|---|
| JP | 04092446 | 3/1992 | |
| JP | 07122620 | 5/1995 | |
| JP | 08139160 | 5/1996 | |
| JP | 08148503 | 6/1996 | |
| JP | 08203858 | 8/1996 | |
| JP | 2002-093881 | * 3/2002 | B25J 17/02 |
| JP | 2002093881 | * 3/2002 | |
| JP | 2004301275 | 10/2004 | |
| JP | 2010228883 | 10/2010 | |
| JP | 2011247155 | 12/2011 | |
| JP | 2012143446 | 8/2012 | |
| KR | 19990028779 | 4/1999 | |
| WO | 8706561 | 11/1987 | |
| WO | 2013120054 | 8/2013 | |

OTHER PUBLICATIONS

Jacob Moore, Adaptive Map/Digital Textbook Project/Belt Friction, 2011, Pennsylvania State University http://adaptivemap.ma.psu.edu/websites/6_friction/belt_friction/beltfriction.html (Year: 2011).*

International Search Report, International Application No. PCT/US2014/052739, dated Nov. 6, 2014 (2 pages).

* cited by examiner

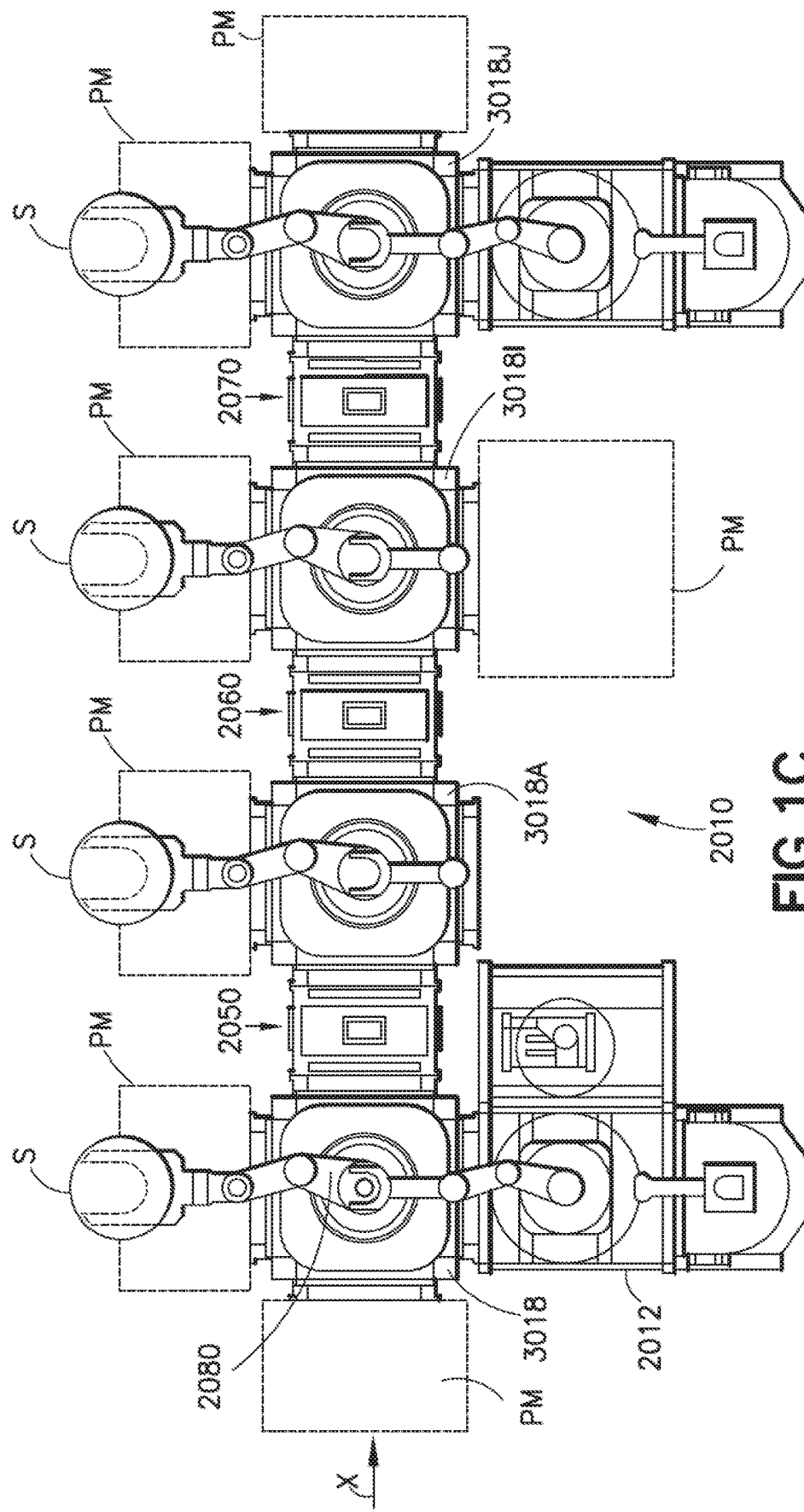

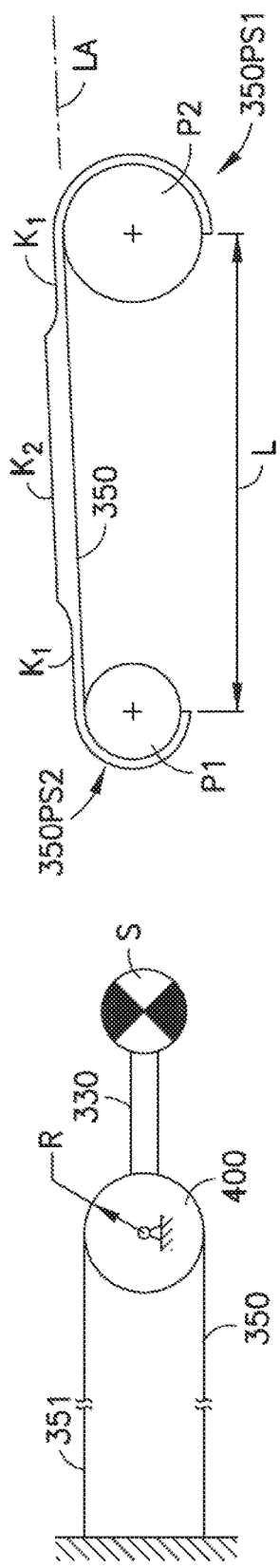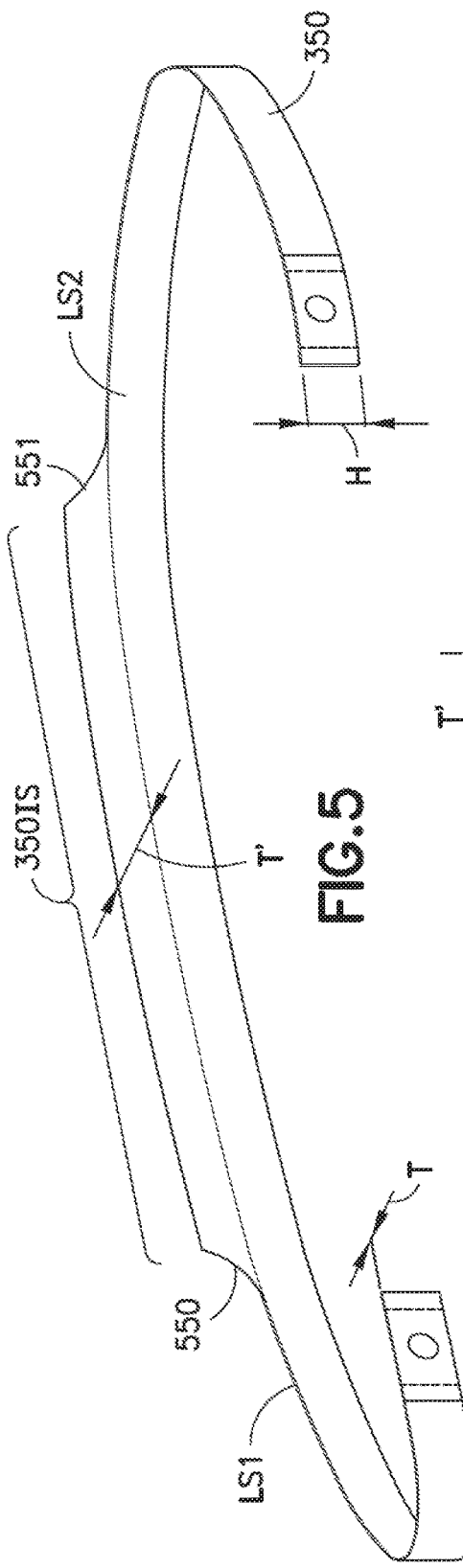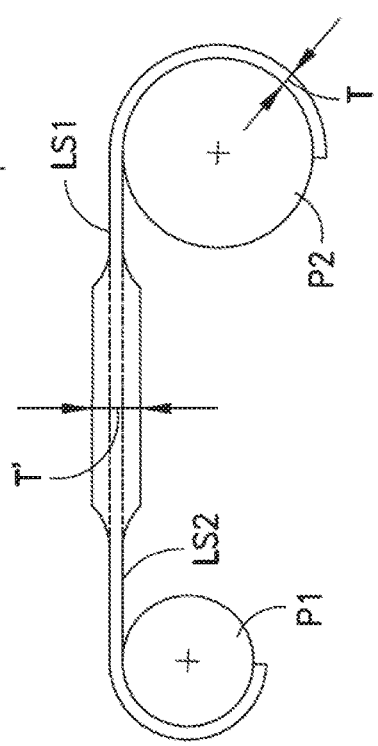

SUBSTRATE TRANSPORT APPARATUS

CROSS-REFERENCE TO RELATED APPLICATIONS

This application is a non-provisional of and claims the benefit of Provisional Patent Application No. 61/869,870 filed on Aug. 26, 2013, the disclosure of which is incorporated by reference herein in its entirety.

BACKGROUND

1. Field

The exemplary embodiments generally relate to robotic transport apparatus and, more particularly, to robotic drive transmissions.

2. Brief Description of Related Developments

As the size of semiconductor substrates increase, the size/length of the robotic arms used to transport those substrates also increases. The robotic arms may use metal bands to transmit torque and motion from a robot drive to the joints of the robotic arm. However, the increased length of the arm links also increases the length of the metal bands. Generally, these metal bands are thin in order to, for example, minimize bending stress and maintain a functional lifetime of the metal bands. As may be realized, the cross sectional area of the metal bands is small because the metal bands are thin. This small cross sectional area may affect the axial stiffness of the band which may result in low natural frequencies of the dynamic drive system which can make servo/drive motor tuning difficult, especially in direct drive systems. For example, the servo band width may be close to the natural frequency of the metal bands and can make it difficult to tune out vibrations and may result in lower performance due to a low servo bandwidth. In non-direct drive systems the low natural frequency of the metal bands may result in long settling times and reduced overall throughput performance.

It would be advantageous to have a drive system in which metal bands are employed without the performance issues noted above.

BRIEF DESCRIPTION OF THE DRAWINGS

The foregoing aspects and other features of the disclosed embodiment are explained in the following description, taken in connection with the accompanying drawings, wherein:

FIGS. 1A-1D are schematic illustrations of processing apparatus incorporating aspects of the disclosed embodiment;

FIGS. 4A and 4B are schematic illustrations of portions of a robotic transport arm in accordance with aspects of the disclosed embodiment;

FIGS. 5 and 5A are schematic illustrations of portions of a robotic transport arm in accordance with aspects of the disclosed embodiment;

DETAILED DESCRIPTION

Referring to FIGS. 1A-1D, there are shown schematic views of substrate processing apparatus or tools incorporating the aspects of the disclosed embodiment as disclosed further herein. Although the aspects of the disclosed embodiment will be described with reference to the drawings, it should be understood that the aspects of the disclosed embodiment can be embodied in many forms. In addition, any suitable size, shape or type of elements or materials could be used.

Figure 1A:
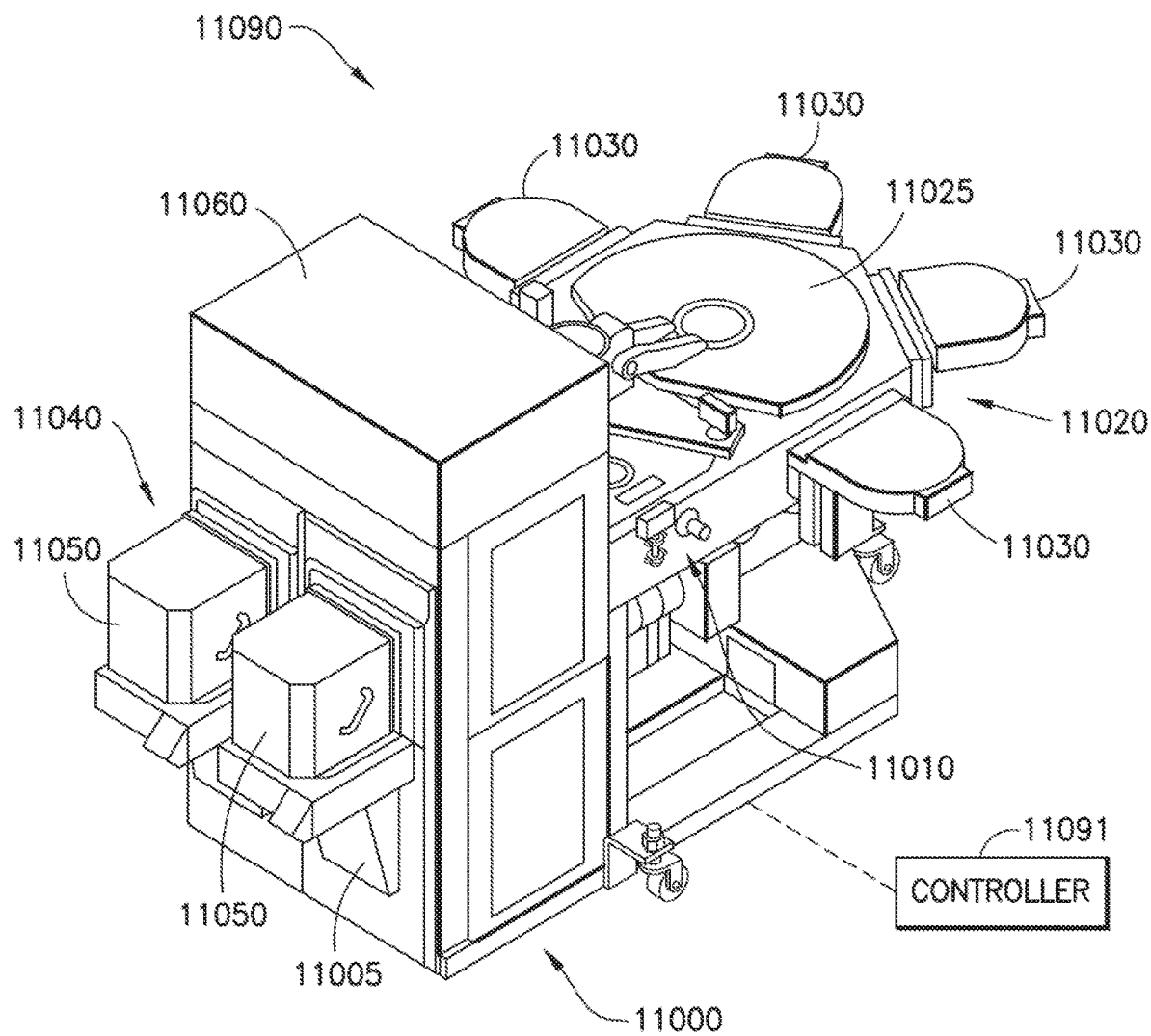
Figure 1B:
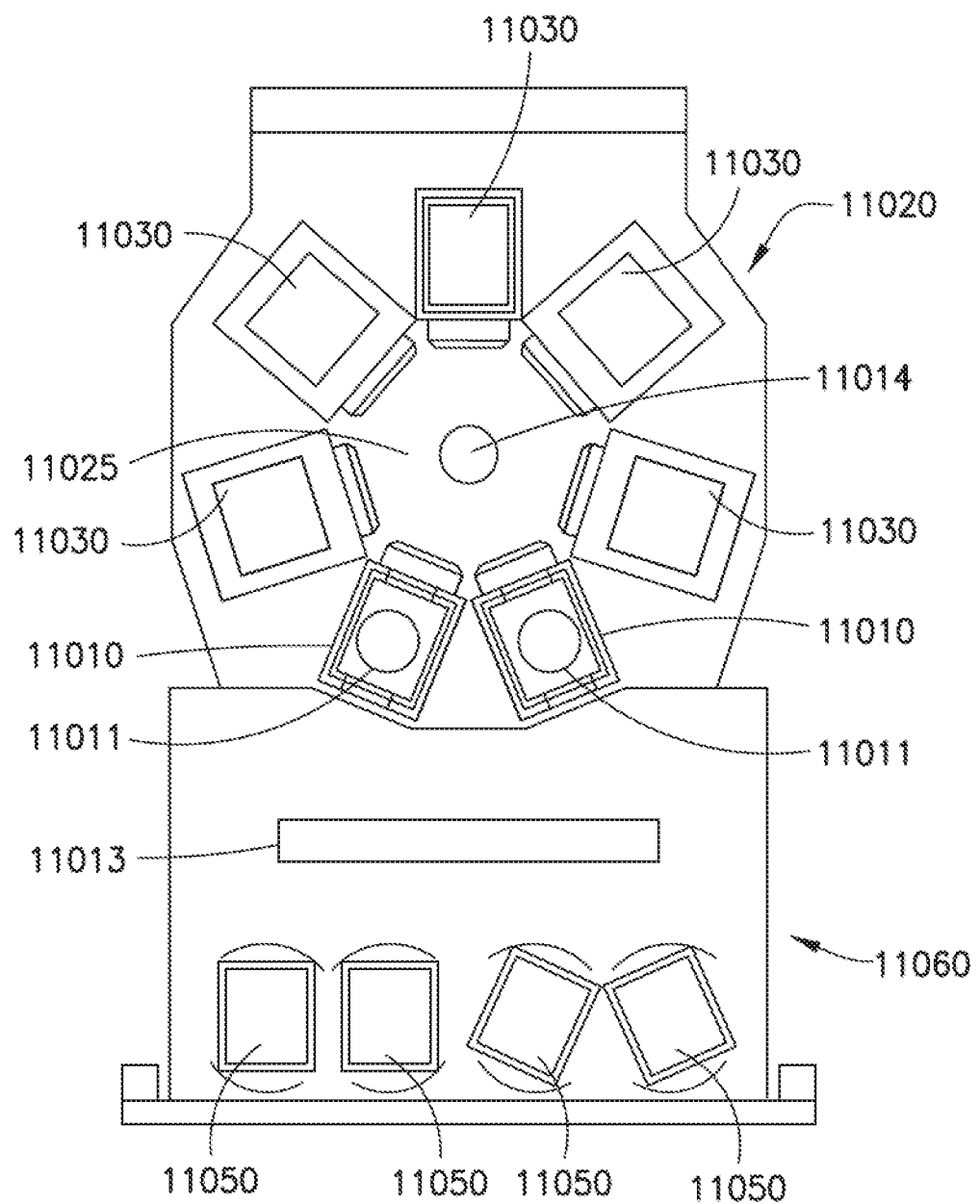

Referring to FIGS. 1A and 1B, a processing apparatus, such as for example a semiconductor tool station 11090 is shown in accordance with an aspect of the disclosed embodiment. Although a semiconductor tool is shown in the drawings, the aspects of the disclosed embodiment described herein can be applied to any tool station or application employing robotic manipulators. In this example the tool 11090 is shown as a cluster tool, however the aspects of the disclosed embodiment may be applied to any suitable tool station such as, for example, a linear tool station such as that shown in FIGS. 1C, 1D and 2 as described in U.S. Pat. No. 8,398,355, entitled "Linearly Distributed Semiconductor Workpiece Processing Tool," issued Mar. 19, 2013, and U.S. Pat. No. 7,901,539, entitled "Apparatus and Methods for Transporting and Processing Substrates," issued Mar. 8, 2011 the disclosures of which are incorporated by reference herein in their entireties. The tool station 11090 generally includes an atmospheric front end 11000, a vacuum load lock 11010 and a vacuum back end 11020. In other aspects, the tool station may have any suitable configuration. The components of each of the front end 11000, load lock 11010 and back end 11020 may be connected to a controller 11091 which may be part of any suitable control architecture such as, for example, a clustered architecture control. The control system may be a closed loop controller having a master controller, cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized.

In one aspect, the front end 11000 generally includes load port modules 11005 and a mini-environment 11060 such as for example an equipment front end module (EFEM). The load port modules 11005 may be box opener/loader to tool standard (BOLTS) interfaces that conform to SEMI standards E15.1, E47.1, E62, E19.5 or E1.9 for 300 mm load ports, SEMI standards for 450 mm load ports, front opening or bottom opening boxes/pods and cassettes. In other aspects, the load port modules may be configured as 200 mm, 300 mm, and/or 450 mm substrate or wafer interfaces or any other suitable substrate interfaces such as for example larger or smaller substrates or flat panels for flat panel displays. Although two load port modules are shown in FIG. 1A, in other aspects any suitable number of load port modules may be incorporated into the front end 11000. The load port modules 11005 may be configured to receive substrate carriers or cassettes 11050 from an overhead transport system, automatic guided vehicles, person guided vehicles, rail guided vehicles or from any other suitable transport method. The load port modules 11005 may interface with the mini-environment 11060 through load ports 11040. The load ports 11040 may allow the passage of substrates between the substrate cassettes 11050 and the mini-environment 11060. The mini-environment 11060 generally includes any suitable atmospheric transfer robot 11013 which may incorporate one or more aspects of the disclosed embodiment described herein. In one aspect the robot 11013 may be a track mounted robot such as that described in, for example, U.S. Pat. No. 6,002,840, the disclosure of which is incorporated by reference herein in its entirety. The mini-environment 11060 may provide a controlled, clean zone for substrate transfer between multiple load port modules.

The vacuum load lock 11010 may be located between and connected to the mini-environment 11060 and the back end 11020. It is noted that the term vacuum as used herein may denote a high vacuum such as $10^{-5}$ Torr or below in which the substrates are processed. The load lock 11010 generally includes atmospheric and vacuum slot valves. The slot valves may provide the environmental isolation employed to evacuate the load lock after loading a substrate from the atmospheric front end and to maintain the vacuum in the transport chamber when venting the lock with an inert gas such as nitrogen. The load lock 11010 may also include an aligner 11011 for aligning a fiducial of the substrate to a desired position for processing. In other aspects, the vacuum load lock may be located in any suitable location of the processing apparatus and have any suitable configuration.

The vacuum back end 11020 generally includes a transport chamber 11025, one or more processing station(s) 11030 and any suitable vacuum transfer robot 11014 which may include one or more aspects of the disclosed embodiment described herein. The transfer robot 11014 may be located within the transport chamber 11025 to transport substrates between the load lock 11010 and the various processing stations 11030. The processing stations 11030 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 11030 are connected to the transport chamber 11025 to allow substrates to be passed from the transport chamber 11025 to the processing stations 11030 and vice versa.

Referring now to FIG. 1C, a schematic plan view of a linear substrate processing system 2010 is shown where the tool interface section 2012 is mounted to a transport chamber module 3018 so that the interface section 2012 is facing generally towards (e.g. inwards) but is offset from the longitudinal axis X of the transport chamber 3018. The transport chamber module 3018 may be extended in any suitable direction by attaching other transport chamber modules 3018A, 3018I, 3018J to interfaces 2050, 2060, 2070 as described in U.S. Pat. No. 8,398,355, previously incorporated herein by reference. Each transport chamber module 3018, 3019A, 3018I, 3018J includes any suitable substrate transport 2080, which may include one or more aspects of the disclosed embodiment described herein, for transporting substrates throughout the processing system 2010 and into and out of, for example, processing modules PM. As may be realized, each chamber module may be capable of holding an isolated or controlled atmosphere (e.g. N2, clean air, vacuum).

Figure 1D:
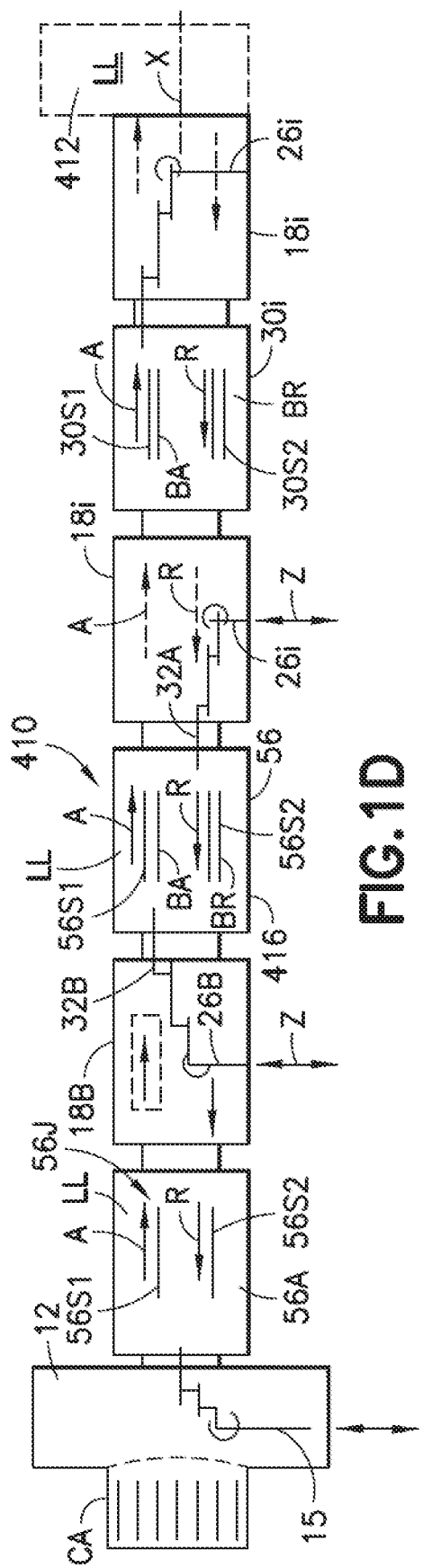

Referring to FIG. 1D, there is shown a schematic elevation view of an exemplary processing tool 410 such as may be taken along longitudinal axis X of the linear transport chamber 416. In the aspect of the disclosed embodiment shown in FIG. 1D, tool interface section 12 may be representatively connected to the transport chamber 416. In this aspect, interface section 12 may define one end of the tool transport chamber 416. As seen in FIG. 1D, the transport chamber 416 may have another workpiece entry/exit station 412 for example at an opposite end from interface station 12. In other aspects, other entry/exit stations for inserting/removing workpieces from the transport chamber may be provided. In one aspect, interface section 12 and entry/exit station 412 may allow loading and unloading of workpieces from the tool. In other aspects, workpieces may be loaded into the tool from one end and removed from the other end. In one aspect, the transport chamber 416 may have one or more transfer chamber module(s) 18B, 18i. Each chamber module may be capable of holding an isolated or controlled atmosphere (e.g. N2, clean air, vacuum). As noted before, the configuration/arrangement of the transport chamber modules 18B, 18i, load lock modules 56A, 56B and workpiece stations forming the transport chamber 416 shown in FIG. 1D is merely exemplary, and in other aspects the transport chamber may have more or fewer modules disposed in any desired modular arrangement. In the aspect shown, station 412 may be a load lock. In other aspects, a load lock module may be located between the end entry/exit station (similar to station 412) or the adjoining transport chamber module (similar to module 18i) may be configured to operate as a load lock. As also noted before, transport chamber modules 18B, 18i have one or more corresponding transport apparatus 26B, 26i, which may include one or more aspects of the disclosed embodiment described herein, located therein. The transport apparatus 26B, 26i of the respective transport chamber modules 18B, 18i may cooperate to provide the linearly distributed workpiece transport system 420 in the transport chamber. In this aspect, the transport apparatus 26B may have a general SCARA (selectively compliant articulated robot arm) arm configuration (though in other aspects the transport arms may have any other desired arrangement such as a frog-leg configuration, telescopic configuration, bi-symmetric configuration, etc.). In the aspect of the disclosed embodiment shown in FIG. 1D, the arms of the transport apparatus 26B may be arranged to provide what may be referred to as a fast swap arrangement allowing the transport to quickly swap substrates from a pick/place location (e.g. a first arm or substrate holder picks a substrate from the location and a second arm or substrate holder places a substrate to that same location substantially immediately after removal of the picked substrate). The transport arm 26B may have a suitable drive section, such as described below, for providing each arm with any suitable number of degrees of freedom (e.g. independent rotation about shoulder and elbow joints with Z axis motion). As seen in FIG. 1D, in this aspect the modules 56A, 56, 30*i* may be located interstitially between transfer chamber modules 18B, 18*i* and may define suitable processing modules, load lock(s), buffer station(s), metrology station(s) or any other desired station(s). For example the interstitial modules, such as load locks 56A, 56 and workpiece station 30*i*, may each have stationary workpiece supports/shelves 56S, 56S1, 56S2, 30S1, 30S2 that may cooperate with the transport arms to effect transport or workpieces through the length of the transport chamber along linear axis X of the transport chamber. By way of example, workpiece(s) may be loaded into the transport chamber 416 by interface section 12. The workpiece(s) may be positioned on the support(s) of load lock module 56A with the transport arm of the interface section. The workpiece(s), in load lock module 56A, may be moved between load lock module 56A and load lock module 56 by the transport arm 26B in module 18B, and in a similar and consecutive manner between load lock 56 and workpiece station 30*i* with arm 26*i* (in module 18*i*) and between station 30*i* and station 412 with arm 26*i* in module 18*i*. This process may be reversed in whole or in part to move the workpiece(s) in the opposite direction. Thus, in one aspect, workpieces may be moved in any direction along axis X and to any position along the transport chamber and may be loaded to and unloaded from any desired module (processing or otherwise) communicating with the transport chamber. In other aspects, interstitial transport chamber modules with static workpiece supports or shelves may not be provided between transport chamber modules 18B, 18*i*. In such aspects, transport arms of adjoining transport chamber modules may pass off workpieces directly from end effector or one transport arm to end effector of another transport arm to move the workpiece through the transport chamber. The processing station modules may operate on the substrates through various deposition, etching, or other types of processes to form electrical circuitry or other desired structure on the substrates. The processing station modules are connected to the transport chamber modules to allow substrates to be passed from the transport chamber to the processing stations and vice versa. A suitable example of a processing tool with similar general features to the processing apparatus depicted in FIG. 1D is described in U.S. Pat. No. 8,398,355, previously incorporated by reference in its entirety.

Figure 2:
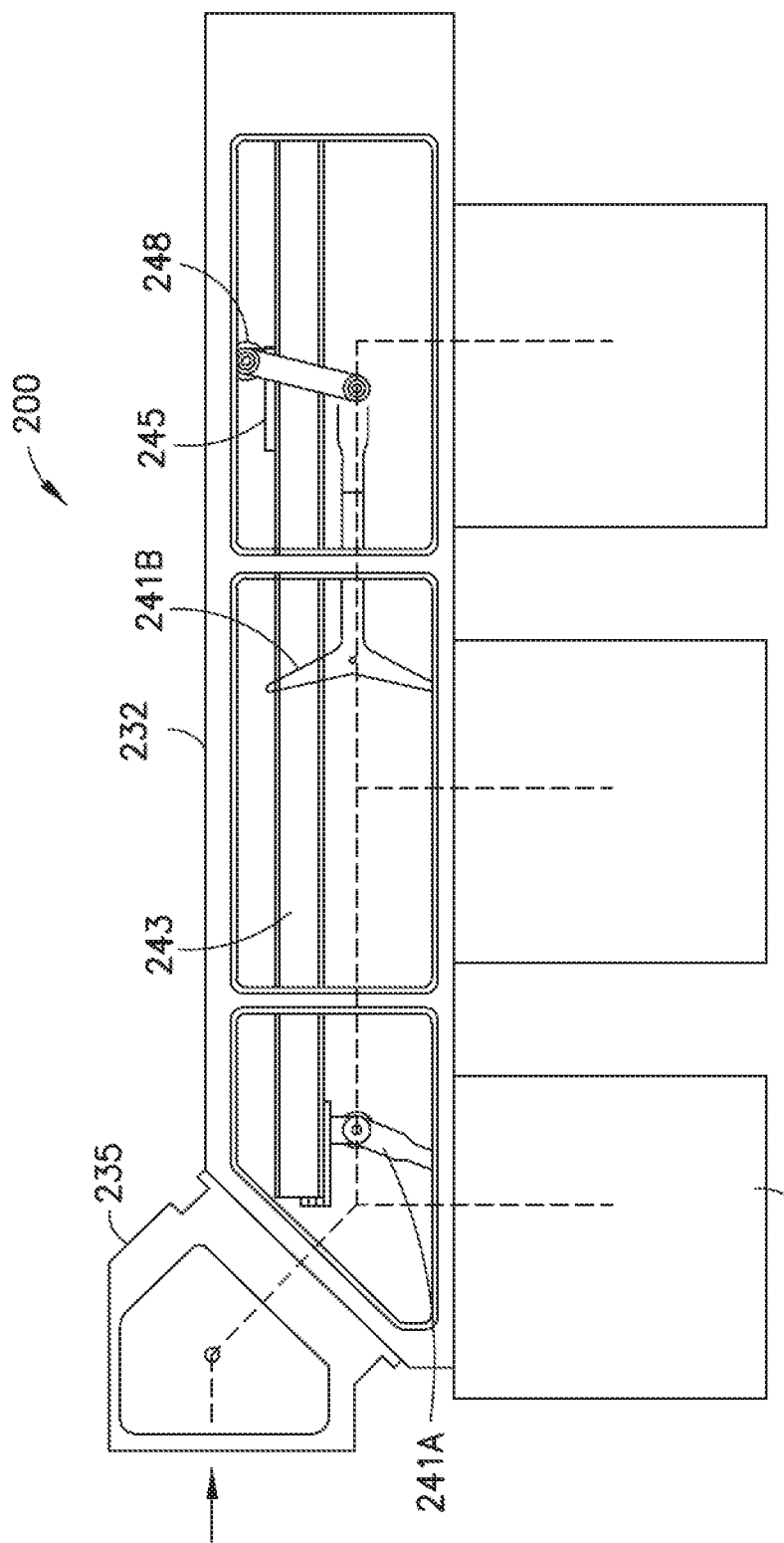
FIG. 2 is a schematic illustration of a processing apparatus incorporating aspects of the disclosed embodiment.

Referring to FIG. 2, another linear exemplary processing tool 200 having a linear transport chamber 232 is illustrated. The processing tool 200 may be substantially similar to those described in U.S. Pat. No. 7,901,539, previously incorporated by reference herein. Here the linear transport chamber 232 has one or more openings to which process modules 231 and/or input/output modules 235 (e.g. load locks) are connected. In this aspect, a linear track 243 is disposed within the transport chamber 232. One or more transport arms 241A, 241B may ride along the linear track 243 for transporting substrates between the input/output module 235 and the process modules 231. The transport arms 241A, 241B may be mounted to respective drive and support mechanisms 245 which ride along the linear track 243 and include at least a portion of a drive transmission for articulating or otherwise effecting the extension and retraction of the arm as well as movement of the arm along the linear track 243. For example, in one aspect at least one linear and/or rotary drive for each arm may be disposed outside a sealed environment of the transport chamber 232 such that the at least one linear and/or rotary drive (not shown) is magnetically coupled to at least one follower or magnetic head 248 of the drive and support mechanisms 245 such that a magnetic coupling between the at least one linear and/or rotary drive and the at least one magnetic head 248 effects the extension of the transport arm 241A, 241B and the linear movement of the transport arm 241A, 241B along the linear track 243 in a manner substantially similar to that described in U.S. Pat. No. 7,901,539 as well as U.S. Pat. No. 8,293,066, entitled "Apparatus and Methods for Transporting and Processing Substrates," issued on Oct. 23, 2012 and U.S. Pat. No. 8,419,341, entitled "Linear Vacuum Robot with Z Motion and Articulated Arm," issued on Apr. 16, 2013, the disclosures of which are incorporated herein by reference in their entireties.

Figure 3A:
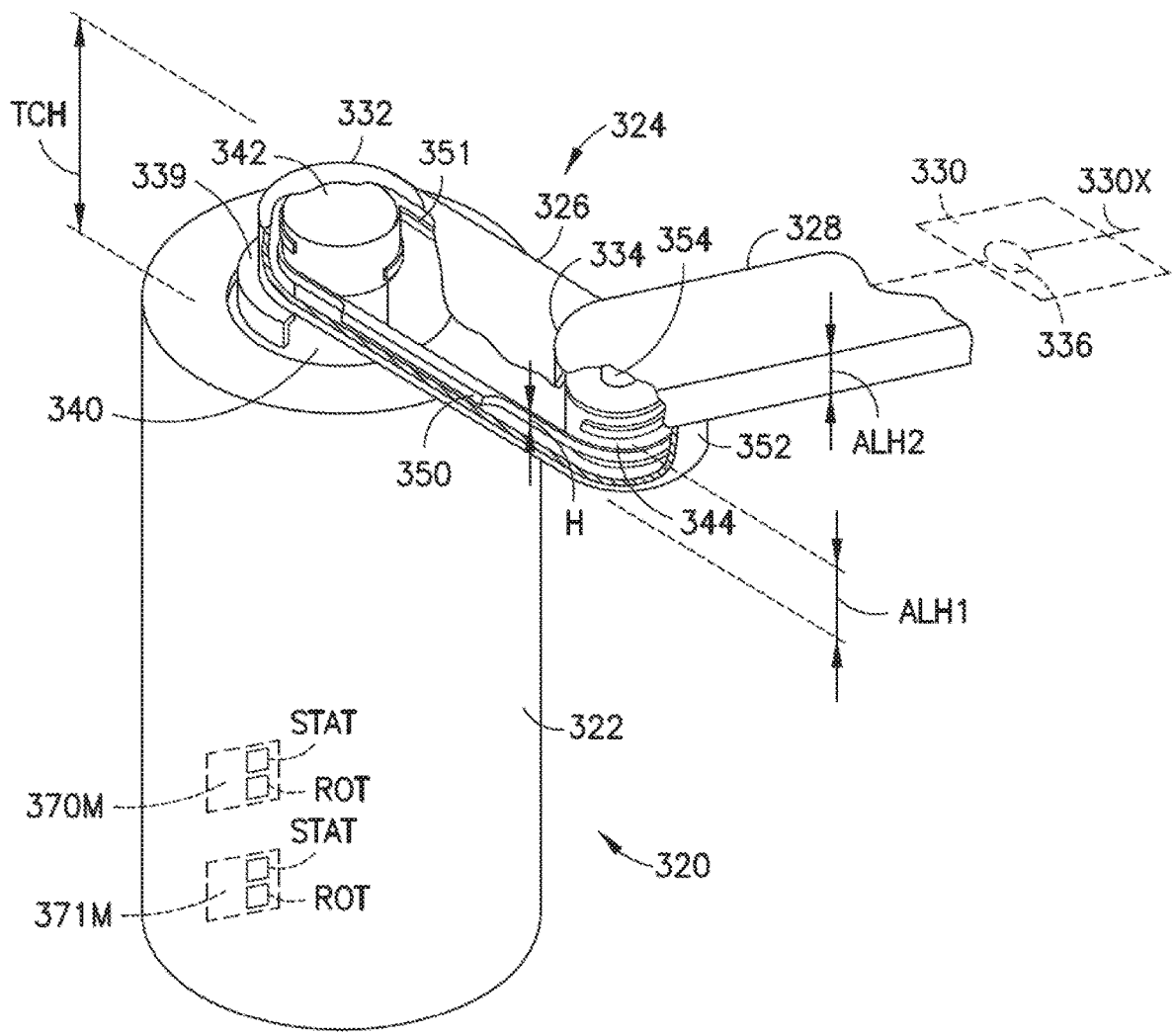
FIGS. 3A, 3B, 3C and 3D are schematic illustrations of portions of a robotic transport apparatus in accordance with aspects of the disclosed embodiment.
Figure 3B:
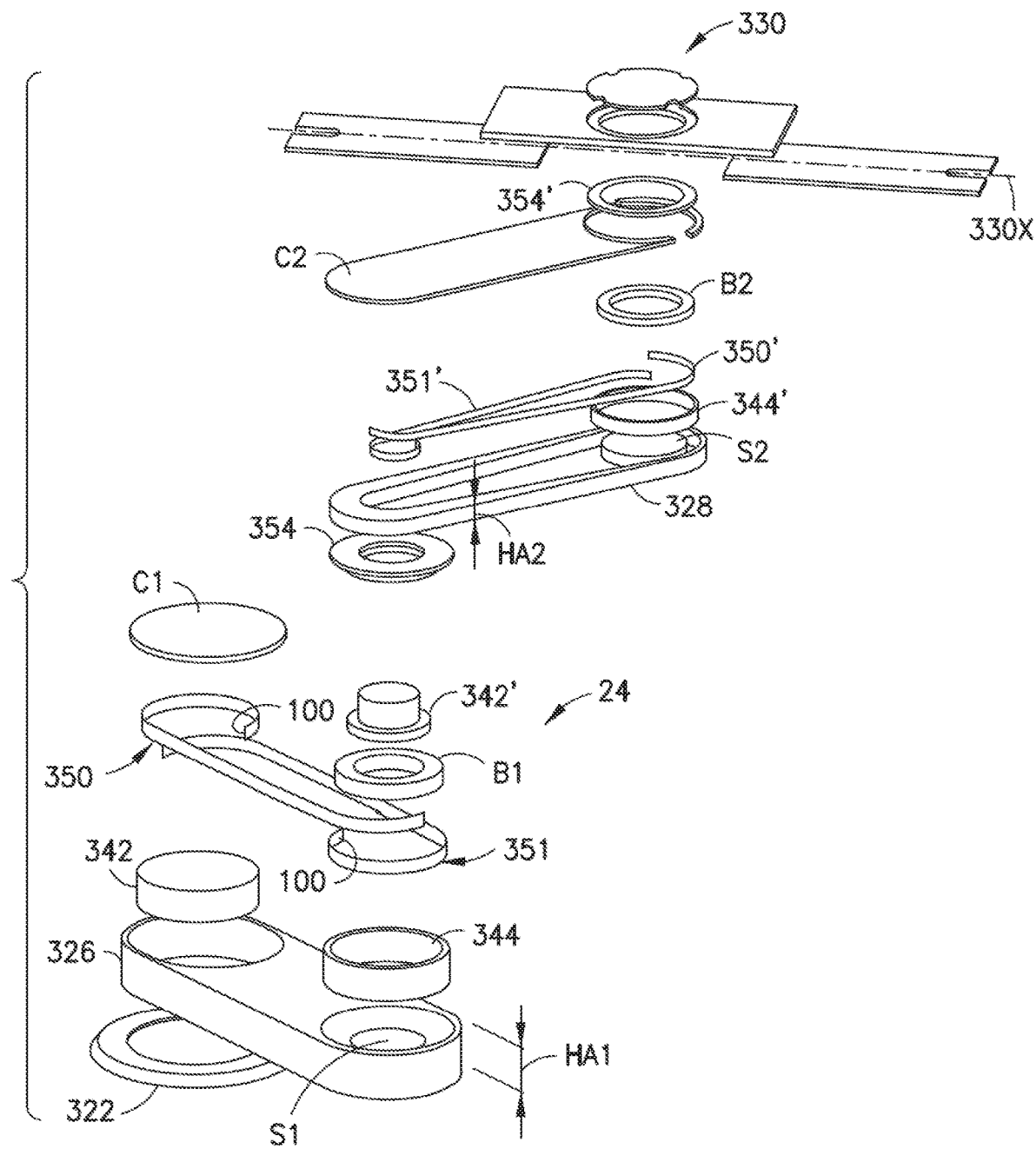

As may be realized, each of the robotic transport apparatus described above may include at least one arm link that is driven by at least one torque transmission band. Referring now to FIGS. 3A and 3B an exemplary torque transmission band configuration for use in the robotic transport apparatus such as those described herein is illustrated in accordance with aspects of the disclosed embodiment. As can be seen in FIGS. 3A and 3B, the robotic transport apparatus 320 includes a transport arm 324 mounted to any suitable base or drive housing 322. In one aspect the transport arm 324 may be a SCARA arm and may include an upper arm 326 having proximate and distal ends, a forearm 328 having proximate and distal ends and at least one substrate support or end effector 330 configured to hold one or more substrates thereon. The proximate end of the upper arm 326 is rotatably connected to the base 322 at a shoulder joint 332. The proximate end of the forearm 328 is rotatably connected to the distal end of the upper arm 326 at an elbow joint 334. The one or more substrate supports 330 may be rotatably connected to the distal end of the forearm 328 at a wrist joint 336. In addition to the SCARA arm illustrated herein, other examples of arm configurations that may be employed with the aspects of the disclosed embodiment include, but are not limited to, the arm configurations described in U.S. patent application Ser. No. 12/117,415 entitled "Substrate Transport Apparatus with Multiple Movable Arms Utilizing a Mechanical Switch Mechanism" filed on May 8, 2008, and in International Patent Application Number PCT/US13/25513 entitled "Substrate Processing Apparatus" and filed on Feb. 11, 2013, the disclosures of which are incorporated by reference herein in their entireties, or any other suitable transport arm that uses belts and/or bands for transmitting torque from one pulley to another pulley for operation of the transport arm regardless of whether the belts and/or bands are located within the drive section (e.g. as with side by side motors driving a shaft arrangement) and/or within the arm links.

As may be realized each arm link 326, 328, 330 of the transport arm may have a respective arm link height ALH1, ALH2 (the height of the substrate holder 330 is not shown). As may also be realized, the height of each arm link ALH1, ALH2 and the overall height of the transport arm (not shown) may be restricted by a height TCH of the transport chamber (such as those described above) in which the transport arm operates. As such, a height H of each of the torque transmission bands located within each arm link for driving the arms may be limited by a respective arm link height. As may be realized, where there are multiple pulleys stacked within the arm link or where each pulley transmission utilizes multiple bands (as described below) the torque transmission band height may be further limited due to multiple bands being vertically stacked one above the other within the arm link. As the size of the substrates carried by the transport arm increase the length of the arm links also increases however, the height restrictions of the arm links and/or transfer chamber may not increase. As will be described below, a thickness of the torque transmission bands may be increased or otherwise changed to provide an increased stiffness of the torque transmission bands while maintaining the relationship between the thickness of each band and the thickness of a respective arm link as will be described in greater detail below. For example, as will also be described in greater detail below, the torque transmission band may extend longitudinally between, e.g., two pulleys and have at least a first longitudinally extending band portion with a first thickness and a second longitudinally extending band portion with a second thickness where the second thickness is greater than the first thickness.

The base 322 may contain one or more servos or motors 370M, 371M configured to drive a respective drive shaft. The transport base or drive 322 may be employed in any suitable atmospheric or vacuum robotic transport such as those described above. The drive may include a drive housing having at least one drive shaft 339, 340 at least partially disposed therein. As may be realized the drive shafts may have any suitable arrangement such as a coaxial or side by side arrangement. Although two drive shafts are illustrated in FIG. 3A in other aspects the drive may include any suitable number of drive shafts. The drive shafts 339, 340 may be mechanically supported or magnetically suspended (e.g. substantially without contact) within the housing in any suitable manner such as that described in U.S. Pat. No. 8,283,813 entitled "Robot Drive with Magnetic Spindle Bearings" issued on Oct. 9, 2012 and U.S. Pat. No. 8,008,884 entitled "Substrate Processing Apparatus with Motors Integral to Chamber Walls" issued on Aug. 30, 2011, the disclosures of which are incorporated by reference herein in their entireties. Each drive shaft 339, 340 of the base 322 may be driven by a respective motor 370M, 371M where each motor includes a stator STAT and a rotor ROT. It is noted that the drive motors described herein may be permanent magnet motors, variable reluctance motors (having at least one salient pole with corresponding coil units and at least one respective rotor having at least one salient pole of magnetic permeable material), or any other suitable drive motors. The stator(s) may be fixed at least partly within the housing and the rotor(s) may be fixed in any suitable manner to a respective drive shaft 339, 340. In one aspect, the stator(s) STAT may be located in an "external" or "non-sealed" environment that is sealed from an atmosphere in which the robot arm(s) 208 operate (the atmosphere in which the robot arm(s) operate is referred to herein as a "sealed" environment which may be a vacuum or any other suitable environment) through the employment of any suitable isolation wall or barrier while the rotor(s) ROT is located within the sealed environment. It is noted that the term "isolation wall" as used herein may refer to a wall made of any suitable non-ferromagnetic material that may be disposed between the moving parts of the robot drive and/or sensors (associated with the drive) and the corresponding stationary parts of the robot drive and/or sensors. Here the first drive shaft 339 may be drivingly connected to one of the motors 370M, 371M for driving rotation of the upper arm 326 about the shoulder joint 332. The second drive shaft 340 (which in this aspect is concentric with the first drive shaft) may be drivingly connected to another one of the motors 370M, 371M for driving rotation of the forearm 328 about the elbow joint 334. It is noted that the motors 370M, 371M for driving each of the arm links (e.g. upper arm, forearm and/or end effector) may be connected in any suitable manner to any suitable controller, such as controller 11091 for controlling the substrate picking and substrate placing operations of the robotic transport apparatus 320.

As can be seen in FIG. 3A, a first pulley 342 is connected to drive shaft 340 at, for example, the shoulder axis 332, so that as the drive shaft 340 rotates the first pulley 342 rotates with the drive shaft 340. A second pulley 344 may be rotatably mounted to, for example, shaft S1 (e.g. using any suitable bearings B1) at the elbow joint 334 and connected to the forearm 328 in any suitable manner, such as by shaft 354 (which may be fixed to the upper arm 326), so that as the second pulley 344 rotates the forearm 328 rotates with the second pulley 344. As may be realized, the first pulley and the second pulley may have any suitable diameters (e.g. drive ratio) relative to each other such that in one aspect the pulleys may have the same diameter or different diameters (e.g. the drive pulley may be smaller than the driven pulley or vice versa). As may also be realized, the first and second pulleys may respectively be drive and driven pulleys. The second pulley 342 may be coupled to the first pulley 342 in any suitable manner, such as by one or more torque transmission bands 350 (two torque transmission bands 350, 351 are illustrated in FIG. 3). The torque transmission bands may be constructed of any suitable material capable of transmitting torque from the first pulley 342 to the second pulley 344. In one aspect the torque transmission bands may be metallic bands constructed of any suitable metal.

The torque transmission bands 350, 351 may not form a continuous circular belt around the pulleys 342, 344. Rather, one end of the torque transmission band 350 may be at least partially wrapped around (e.g. in a clockwise direction) and affixed to the first pulley 342 while the other end of the torque transmission band 350 may be at least partially wrapped round (e.g. in a counter-clockwise direction) and affixed to the second pulley 344. The ends of the torque transmission band 350 may be affixed to a respective pulley 342, 344 in any suitable manner such as with pins or any other suitable removable or non-removable chemical or mechanical fastener. A second torque transmission band 351, substantially similar to torque transmission band 350 may be affixed at its ends to the pulleys 342, 342 in a manner substantially similar to that described above with respect to torque transmission band 350, however the direction in which the torque transmission band 351 is wrapped around the pulleys 342, 344 may be reversed (e.g. one end of the torque transmission band 351 is wrapped in a counter-clockwise direction around pulley 342 and the other end of the torque transmission band 351 is wrapped around the pulley 344 in a clockwise direction). This dual torque transmission band configuration places both torque transmission bands 350, 351 in constant tension so that neither torque transmission band goes slack.

As may be realized the substrate support 330 may be slaved, e.g. using any suitable transmission such as the torque transmission band and pulley transmissions described herein, so that a longitudinal axis 330X of the substrate support 330 remains aligned with an axis of extension and retraction of the robotic arm 324. For example, referring to FIG. 3B a first pulley 342' may be fixed to the shaft S1 and extend at least partially into the forearm 328. A second pulley 344' may be rotatably mounted at the wrist joint 336 such as on shaft S2 (which may be fixed to the forearm 328) using any suitable bearings B2. The second pulley 344' may be connected to the end effector 330 in any suitable manner, such as with shaft 354' so that as the second pulley 344' rotates the end effector 330 rotates with the second pulley 344'. Torque transmission bands 350', 351', substantially similar to torque transmission bands 350, 351, may couple the first pulley 342' to the second pulley 344' such that relative movement between the forearm 328 and upper arm 326 causes rotation of the second pulley 344' which in turn rotates the end effector 330 relative to the upper arm and forearm so that the longitudinal axis 330X of the end effector remains aligned with the axis of extension and retraction. In other aspects a third motor and drive shaft may be added to the robotic transport 320 for driving the rotation of the substrate support 330 about the wrist joint 336 in a manner substantially similar to that described herein with respect to the forearm.

As may be realized, referring again to FIG. 3A, while the substrate holder 330 is illustrated as a double sided end effector (e.g. an end effector capable of holding one or more substrates on opposite sides of the end effector axis of rotation or wrist joint), in other aspects the substrate holders of the transport arms described herein may have any suitable configuration such as, for example, a single sided end effector, a batch end effector (e.g. capable of holding more than one substrate in a stack or side by side) or a combination thereof. As may also be realized, the upper arm 326 and forearm 328 links of the transport arm 324 may have any suitable covers C1, C2 for sealing or otherwise isolating the interior of the arm links from the environment in which the transport arm operates so that any particles generated by the bands and pulleys may not be transferred outside the arm links.

Figure 3C:
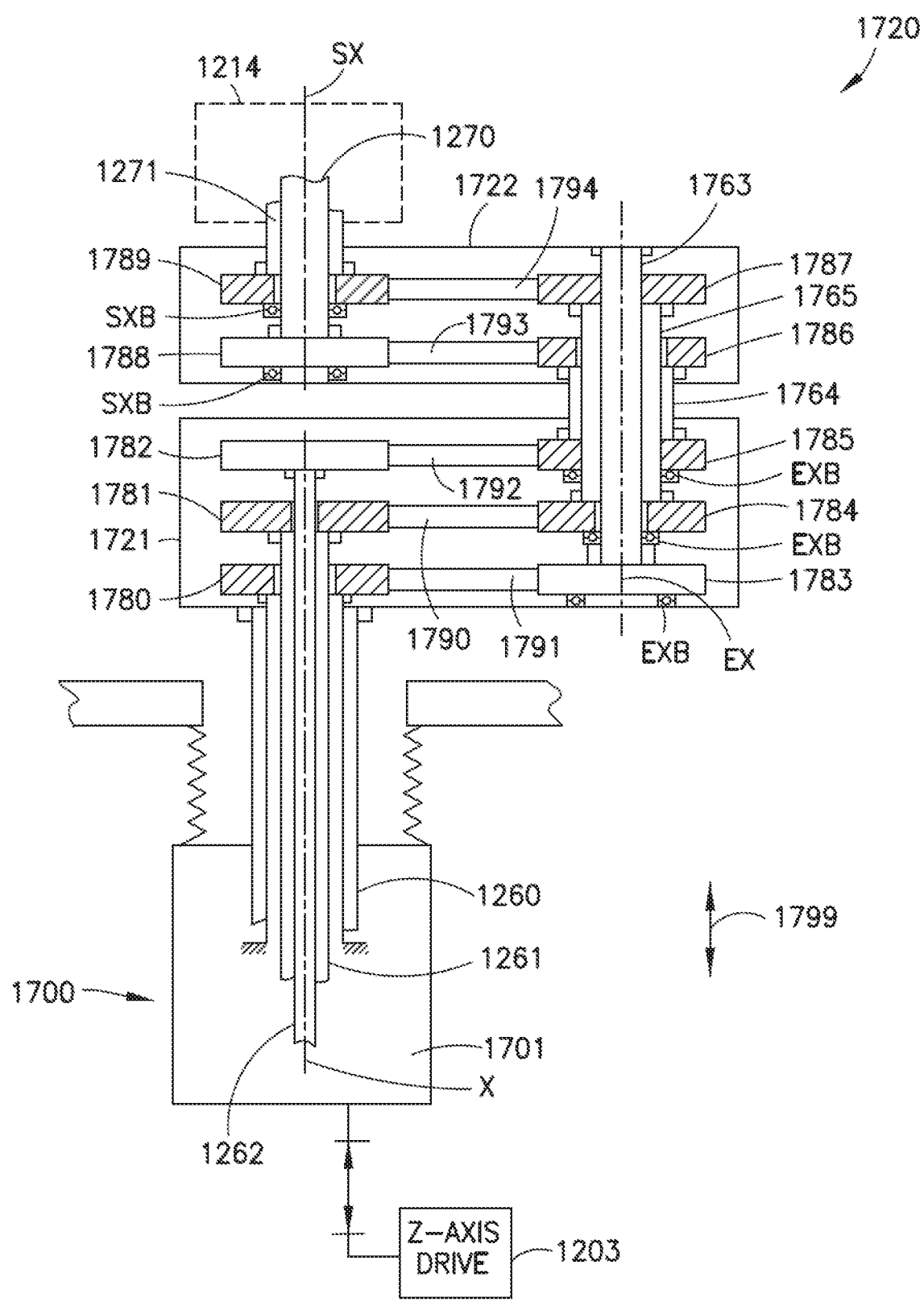

Referring now to FIG. 3C, as may be realized any suitable arm link of the robotic transport apparatus described herein may be slaved and driven by a torque transmission band such as those described herein. For example, a robotic transport apparatus illustrated in FIG. 3C includes an arm 1720 having a first or upper arm link 1721 and a second or forearm link 1722 rotatably mounted to the first arm link 1721. The arm links may be driven by any suitable drive section 1700. In this aspect the drive section includes a coaxial drive shaft arrangement having an inner drive shaft 1262, a middle drive shaft 1261 and an outer drive shaft 1260 each driven by respective drive motors (not shown). The outer drive shaft 1260 may be coupled to the first arm link 1721 about a drive axis of rotation X so that as the outer drive shaft 1260 rotates the first arm link 1721 rotates with it. The second arm link 1722 may be slaved to, for example, a housing 1701 of the drive section 1700 (or any other suitable location) so that a shoulder axis SX of the second arm link 1722 is constrained to travel along a substantially linear path as the base arm 1720 is extended and retracted (e.g. a single drive motor causes the extension and retraction of the arm 1720). For example, a first pulley 1780 may be mounted substantially concentrically with the drive axis of rotation X and grounded to, for example, the housing 1701 of the drive section 1700 (or any other suitable portion of the transfer apparatus) in any suitable manner so that the first pulley 1780 is rotationally stationary relative to the first arm link 1721. In other aspects the first pulley 1780 may be rotationally fixed in any suitable manner. A slaved or second pulley 1783 may be rotatably mounted at an elbow axis EX of the arm 1720 in any suitable manner such as by any suitable bearings EXB. The second pulley 1783 may be coupled to the second arm link 1722 by, for example, shaft 1763 so that as the second pulley 1783 rotates the second arm link 1722 rotates with it. The pulleys 1780, 1783 may be coupled to each other in any suitable manner such as by a torque transmission band 1791 such as described herein. In one aspect the pulleys 1780, 1783 may be coupled to each other with at least two torque transmission bands terminated on either ends of the pulleys and then tensioned against each other to substantially eliminate slack and backlash as described above. In other aspects any suitable transmission member may be used to couple the pulleys 780, 783.

In this aspect a coaxial spindle (drive shaft arrangement) having outer shaft 1271 and inner shaft 1270 may be located at the shoulder axis SX of the second arm link 1722. The outer shaft 1271 may be driven by, for example, the middle drive shaft 1261 in any suitable manner. For example, a pulley 1781 may be coupled to the middle drive shaft 1261 so that as the drive shaft 1261 rotates the pulley 1781 rotates with it. An idler pulley 1784 may be disposed within the first arm link 1721 for rotation about elbow axis EX. The idler pulley 1784 may be coupled to shaft 1765 so that as the idler pulley 1784 rotates the shaft 1765 rotates with it. The shaft 1765 and pulley 1784 may be supported in any suitable manner such as with any suitable bearings EXB. The idler pulley 1784 may be coupled to pulley 1781 in any suitable manner such as through any suitable transmission 1790 substantially similar to those described herein. A second idler pulley 1787 may also be coupled to the shaft 1765 within the second arm link 1722 so that the pulleys 1784 and 1787 rotate in unison. A shoulder pulley 1789 may be coupled to the shaft 1271 so that the shaft 1271 and shoulder pulley 1789 rotate in unison. The second idler pulley 1787 may be coupled to the shoulder pulley 1789 in any suitable manner, such as through any suitable transmission 794 substantially similar to those described herein.

The inner shaft 1270 of the coaxial spindle may be driven by, for example, the inner drive shaft 1262 in any suitable manner. For example, a pulley 1782 may be coupled to the inner drive shaft 1262 so that as the drive shaft 1262 rotates the pulley 1782 rotates with it. An idler pulley 1785 may be disposed within the first arm link 1721 for rotation about elbow axis EX. The idler pulley 1785 may be coupled to shaft 1764 so that as the idler pulley 1785 rotates the shaft 1764 rotates with it. The shaft 1764 and pulley 1785 may be supported in any suitable manner such as with any suitable bearings EXB. The idler pulley 1785 may be coupled to pulley 1782 in any suitable manner such as through any suitable transmission 792 substantially similar to those described herein. A second idler pulley 1786 may also be coupled to the shaft 1764 within the second arm link 1722 so that the pulleys 1785 and 1786 rotate in unison. A shoulder pulley 1788 may be coupled to the inner shaft 1270 so that the shaft 1270 and shoulder pulley 1788 rotate in unison. The second idler pulley 1786 may be coupled to the shoulder pulley 1788 in any suitable manner, such as through any suitable transmission 1793 substantially similar to those described herein. As may be realized, in one aspect, any suitable substrate holder(s) may be mounted to the shafts 1270, 1270 in any suitable manner. In another aspect any suitable transfer arm 1214 (e.g. having any suitable number of arm links and substrate holders) may be mounted to the shafts 1270, 1270 such that the arm 1720 is configured as a "boom" or "base" type arm for transporting the transfer arm 1214 through, for example, an elongated transfer chamber as described in International Patent Application Number PCT/US13/25513 entitled "Substrate Processing Apparatus" and filed on Feb. 11, 2013 the disclosure of which was previously incorporated herein by reference in its entirety.

Figure 3D:
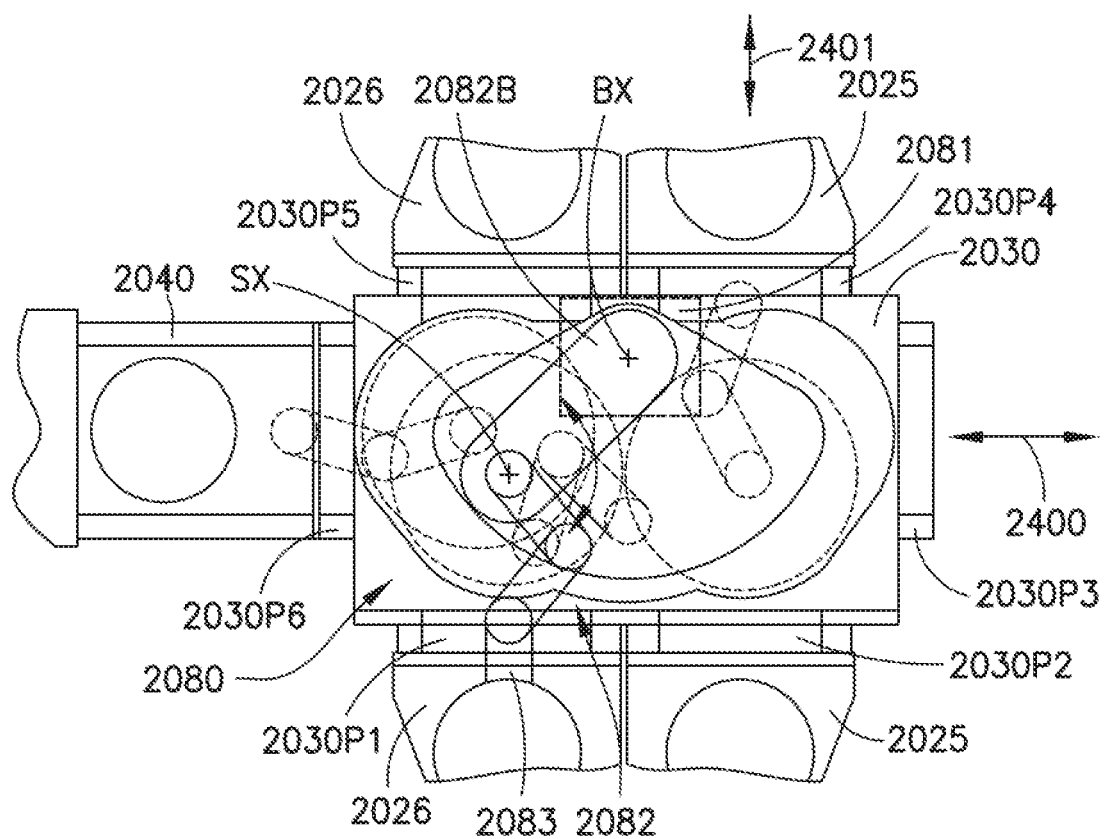

For example, referring to FIG. 3D an automation or transfer module 2030 is illustrated in accordance with an aspect of the disclosed embodiment where substrates are transferred between processing tool modules 2025, 2026, 2040 through the automation module 2030 with a single touching of the substrate. The process tool modules may be coupled to the automation module 2030 in any suitable manner (e.g. side by side, stacked one above the other and/or any other suitable arrangement) such as through ports 2030P1-2030P6 of the automation module 2030. The automation module 2030 includes transfer robot 2080. In one aspect the transfer robot 2080 may include a drive section 2081 which may be substantially similar to those described above. A boom or base arm 2082B may be rotatably mounted to the drive section 2081 and one or more multilink arms 2082 having one or more respective substrate holders 2083 may be rotatably mounted to the base arm 2082B at a shoulder axis SX. The drive section 2081 may be configured to rotate the arm(s) 2082 and end effector(s) 2083 about the shoulder axis SX as a unit so that the arm(s) 2082 can transfer substrates in the direction of arrow 2400 (e.g. along an a longitudinal axis of the automation module 2030 and/or vacuum tunnel) as well as in the direction of arrow 2401 for transferring substrates to both lateral sides of the automation module 2030. As may be realized, the base arm 2082B can be rotated about axis BX for transporting the one or more multilink arms 2082 and their end effectors in the direction 2400 along a length of the automation module 2030.

Referring again to FIG. 3C, the transport apparatus described herein may include any suitable Z axis drive 1203. The Z axis drive 1203 may be configured to move the transfer arm in a direction 1799 substantially perpendicular to an axis of extension/retraction of the transport arm.

Referring now to FIGS. 4A and 4B, torque transmission band 350, 351 stiffness may impact the performance of the robotic arm along with one or more of the end effector/payload inertia and drive torsion natural frequency. For example, at least the torque transmission band stiffness may impact arm responses that may be a function of the torque transmission band stiffness such as acceleration of the arm, jerk and jerk rate of the arm, and a maximum velocity of the arm. Also, longer transport arm links may also affect the stiffness of the torque transmission band because as the arm length increases so does the displacement of the band from strain in the transport arm. The change in angular velocity of the transport arm links due to an increased length of the transport arm links may also produce a reaction in, e.g. the first modes of the band's natural frequency such as along the longitudinal axis of the band and/or along the lateral axis of the torque transmission band. This frequency mode of vibration may also affect the drive motors, positioning accuracy and settling performance of the robotic arm when, for example, the arm is extended to any suitable substrate holding location as torque transmission band frequency mode of vibration is usually the lowest mode of vibration in the robotic arm. The natural frequency of the torque transmission bands 350, 350 can be written as $$f = \frac{1}{2\pi}\sqrt{\frac{2Kr^2}{I}} \quad [1]$$

where r is the pulley radius and I is the substrate holder and payload (e.g. substrate S) inertia. K is the stiffness (spring modulus) of each torque transmission band which can be written as $$K = \frac{EA}{L} \quad [2]$$

Where A is the cross sectional area of the torque transmission band, E is the modulus of elasticity and L is the free length of the torque transmission band (e.g. the length of the torque transmission band between points of contact with the respective drive and driven pulleys P1, P2) along a longitudinal axis LA of the torque transmission band. As can be seen in equation [2] the stiffness of each torque transmission band is inversely proportional to the torque transmission band length L. Due to the increasing size of the semiconductor substrates from 300 mm to 450 mm and beyond, the length of the arm links (e.g. upper arm, forearm, end effector) of the robotic arm must also increase. As such it is desired to increase the stiffness K and/or frequency f of the torque transmission bands.

In one aspect the frequency f may be maximized such that the natural frequency of the torque transmission bands do not interfere with tuning of the robotic arm motors. In one aspect the frequency can be increased by increasing the cross sectional area of the torque transmission bands for a given torque transmission band height. For example, still referring to FIG. 4B and to FIG. 5 each torque transmission band, such as torque transmission band 350 for example, has lateral sides LS1, LS2, a predetermined or fixed height H and a thickness T. Each torque transmission band also includes pulley interface sections 350PS1, 350PS2 and a portion or section of increased lateral thickness/cross section 350IS. It is noted that the thickness T of the torque transmission band, at least in the pulley interface sections 350PS1, 350PS2, has to be sufficiently thin to allow flexure so that, e.g., the torque transmission band can wrap around the pulleys P1, P2 while the height H of the torque transmission band is restricted or otherwise fixed by a height HA1, HA2 and/or profile of a respective arm link 326, 328 (see FIG. 3B) in which the torque transmission band is located. The cross sectional area of the torque transmission bands can be increased by increasing the thickness T of the torque transmission band (e.g. for the predetermined/restricted height H) in a lateral direction to a thickness T' at least over the portion or segment 350IS of the torque transmission band length L (e.g. so that the torque transmission band has a variable lateral thickness) to increase the stiffness of the torque transmission band such that the equivalent stiffness $K_{eq}$ for each torque transmission band can be written as $$K_{eq} = \frac{K_1 K_2}{K_1 + 2K_2} \quad [3]$$

where $K_1$ is the stiffness of each portion of the torque transmission band having thickness T and $K_2$ is the stiffness of the portion of the torque transmission band having increased thickness T'. As can be seen in FIGS. 4B and 5 the variable thickness of the torque transmission band 350 can be effected by increasing the cross sectional area of the torque transmission band, e.g. in the lateral direction, along the segment 350IS such that the thickness T of the band is increased to thickness T'. In one aspect segment 350IS of the torque transmission band 350 may be a non-flexing band segment where the term "non-flexing" indicates that the segment 350IS of increased cross section/thickness T' is not expected to bend due to contact with or under the influence of the pulleys P1, P2. In other aspects the segment 350IS may allow for some predetermined degree of flexibility.

Still referring to FIG. 5 the increased thickness T' of the torque transmission band 350 can be provided in any suitable manner. In one aspect, as shown in FIG. 5, the torque transmission band may be formed in any suitable manner so that the pulley interface sections 350PS1, 350PS2 and the section of increased lateral thickness/cross section 350IS are constructed of a single unitary piece. As may be realized, the additional thickness of the band may extend from or otherwise be formed on one or more of the lateral sides LS1, LS2 of the torque transmission band 350. In this aspect, the increased thickness T' is shown extending from lateral side LS1 but in other aspects the increased thickness may extend from lateral side LS2 or from both lateral sides LS1, LS2 (see FIG. 5A).

Figure 6:
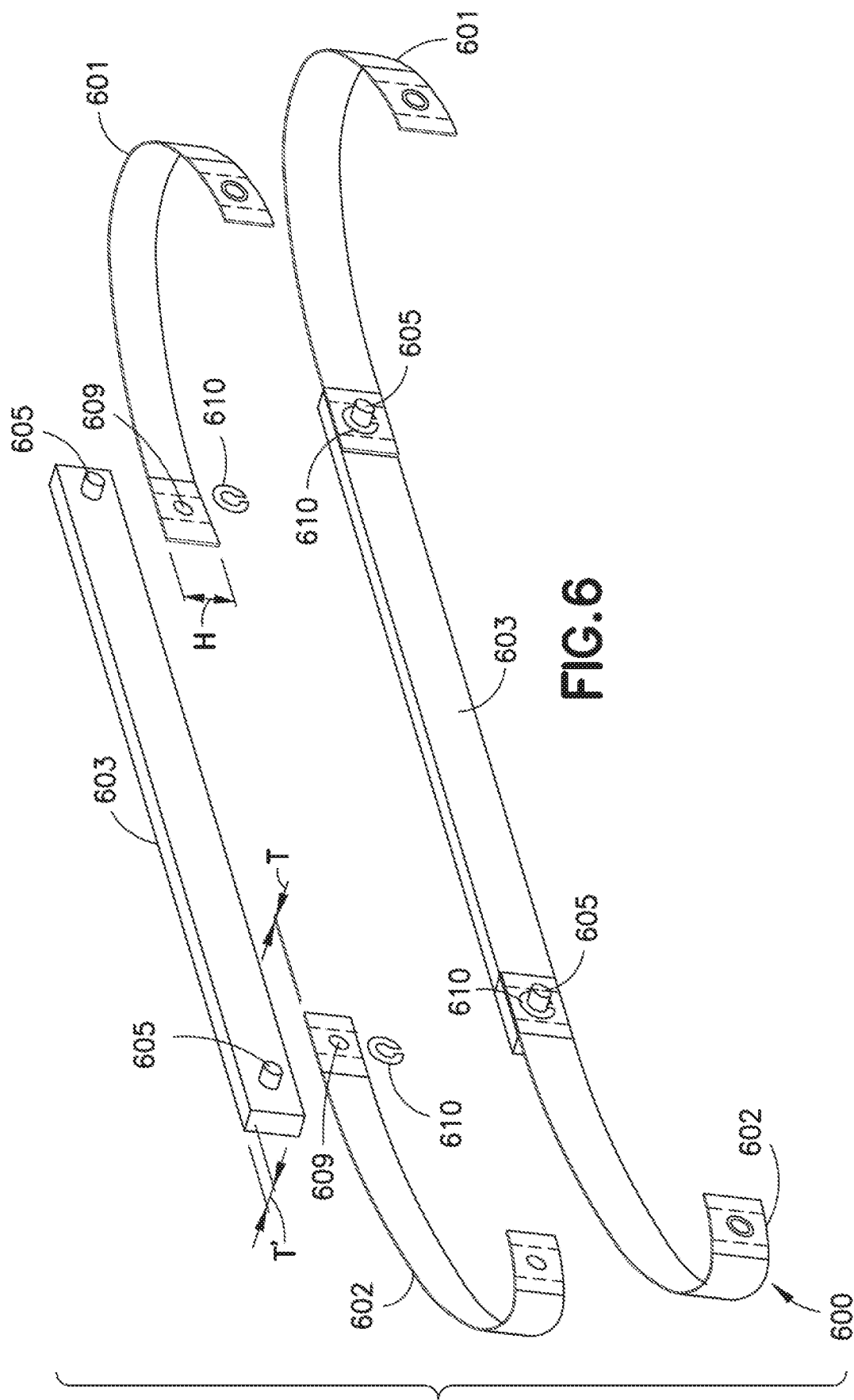
FIG. 6 is a schematic illustration of a portion of a robotic transport arm in accordance with aspects of the disclosed embodiment.

Referring to FIG. 6, in another aspect of the disclosed embodiment the portions/segments of the drive belt may be distinct pieces that are mechanically fastened or otherwise joined together. For example, drive belt 600 (which may be substantially similar to the drive belts described above) may include pulley interface segments 601, 602 having the thickness T and the height H. The drive belt 600 may also have a segment of increased thickness 603 (referred to herein as a "plate segment 603" for explanatory purposes) having the thickness T', height H and any suitable predetermined length corresponding to, for example, a length of an arm link in which the torque transmission band is employed and/or the free length of the band. The plate segment 603 may include standoffs or other suitable protrusions 605 that laterally extend from a lateral side of the plate segment 603. Each of the pulley interface segments 601, 602 may include an aperture 609 through which the protrusions 605 extend. The protrusions may be fitted with any suitable recess, slot, aperture, threads etc. configured to interface with any suitable retaining member 610 (e.g. any suitable clip, nut, pin, etc.) such that when assembled the pulley interface segments 601, 602 are disposed between the plate segment 603 and a respective retaining member 610. In this aspect, the protrusion 605 and aperture 609 connection between the plate segment 603 and each of the pulley interface segments 601, 602 may allow for self-alignment of the plate segment 603 and each of the pulley interface segments 601, 602 when the torque transmission band 600 is under tension. In other aspects, the pulley interface segments 601, 602 may be chemically or mechanically bonded or otherwise affixed to the plate segment 603 in any suitable manner such as by for example, chemical fasteners, welding, brazing, epoxy, or any other suitable mechanical fasteners such as, for example, screws, bolts/nuts, clips, snaps, etc.

Figure 7:
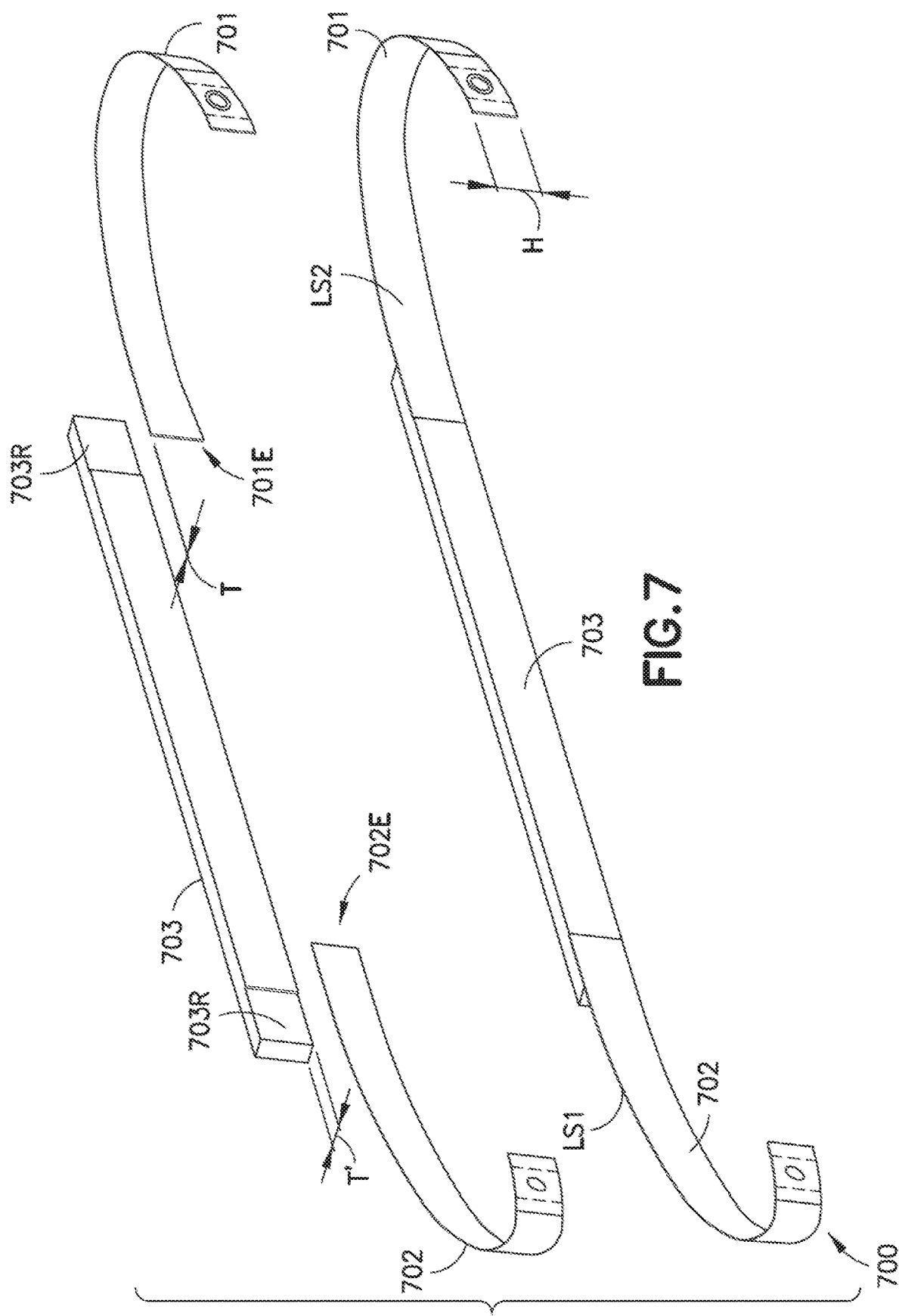
FIG. 7 is a schematic illustration of a portion of a robotic transport arm in accordance with aspects of the disclosed embodiment.

Referring to FIG. 7, another drive belt 700 is illustrated in accordance with aspects of the disclosed embodiment. The drive belt 700 may be substantially similar to torque transmission band 600 however, in this aspect the pulley interface segments 701, 702 may be chemically or mechanically affixed to the plate segment 703 in any suitable manner. For example, the plate segment 703 may have one or more recesses 703R disposed on each longitudinal end of the plate segment 703. The recesses 703R may be shaped and sized to receive an end 701E, 702E of a respective pulley interface segment 701, 702. The ends 701E, 702E of each pulley interface segment 701, 702 may be chemically or mechanically bonded or otherwise affixed to the plate segment 703 in any suitable manner such as by for example, chemical fasteners, welding, brazing, epoxy, etc. As may be realized any suitable alignment fixture may be employed for aligning the pulley interface segments 701, 702 and the plate segment 703 during assembly.

Figure 8:
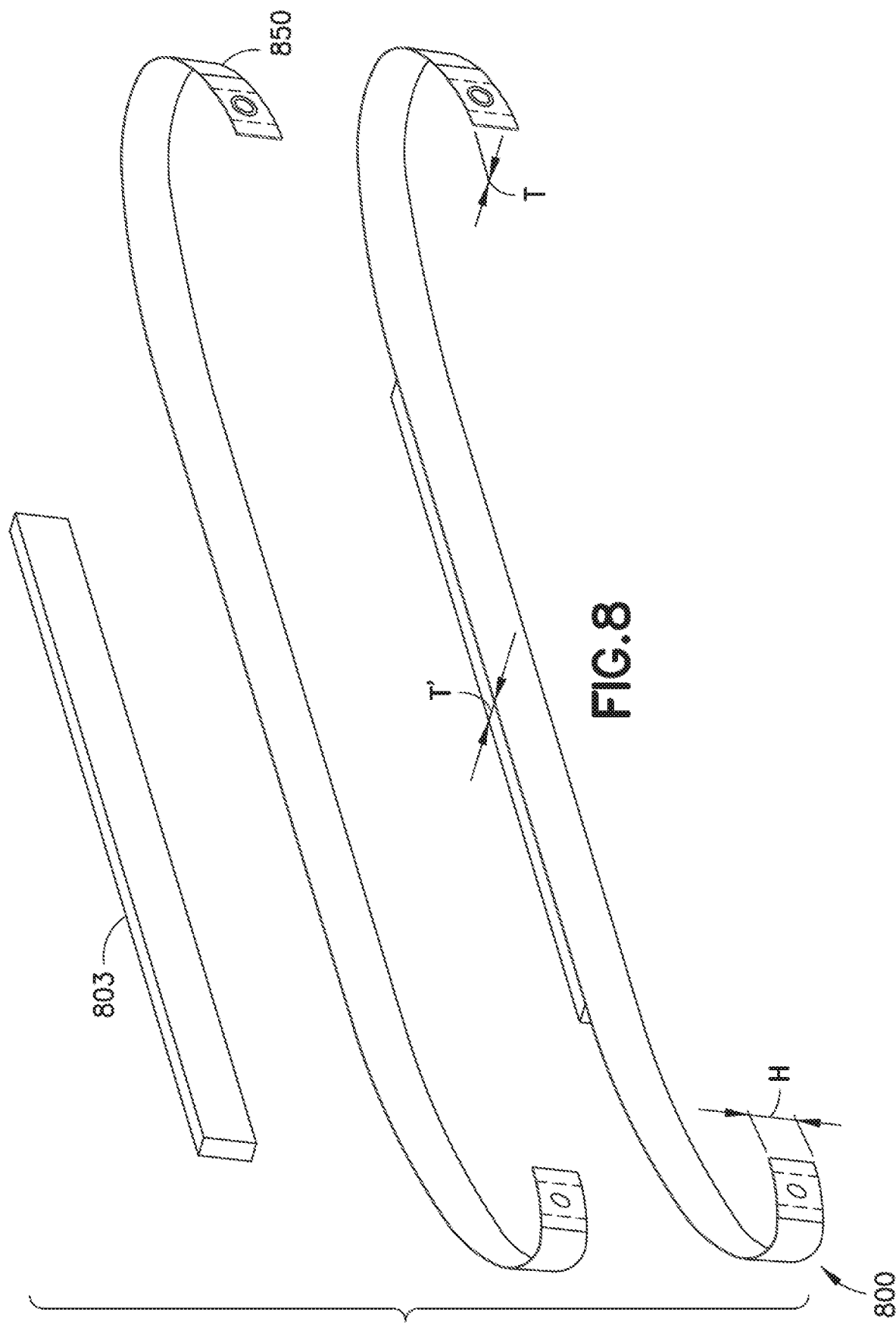
FIG. 8 is a schematic illustration of a portion of a robotic transport arm in accordance with aspects of the disclosed embodiment.

Referring now to FIG. 8, a torque transmission band 800 is illustrated in accordance with aspects of the disclosed embodiment. The torque transmission band 800 may be substantially similar to those described above however, in this aspect the torque transmission band 800 includes a monolithic band 850 and a plate segment 803 that is affixed to the monolithic band to form a band doubler (e.g. the plate segment extends longitudinally along a length of the band and is in substantial contact with the band along that longitudinal length). The plate segment 850 may be chemically or mechanically bonded or otherwise chemically or mechanically affixed to the monolithic band 800 in any suitable manner such as in a manner substantially similar to those described above. As may be realized any suitable alignment fixture may be employed for aligning the monolithic band 850 and the plate segment 803 during assembly.

Figure 9A:
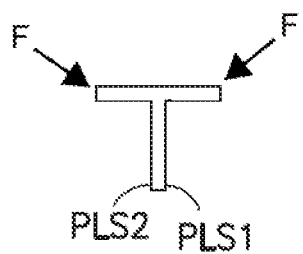
FIGS. 9A-9K are schematic illustrations a portion of a robotic transport arm in accordance with aspects of the disclosed embodiment.
Figure 9B:
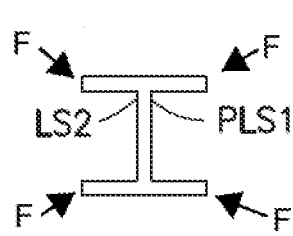
Figure 9C:
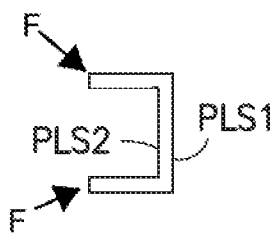
Figure 9D:
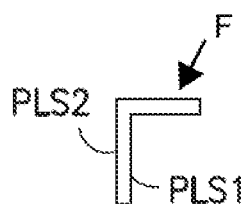
Figure 9E:
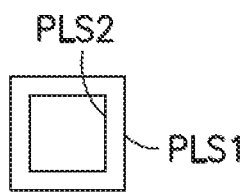
Figure 9F:
Figure 9G:
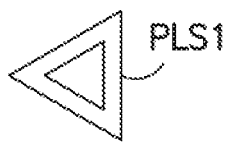
Figure 9H:
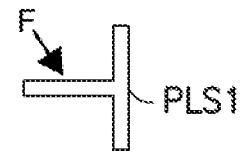
Figure 9I:
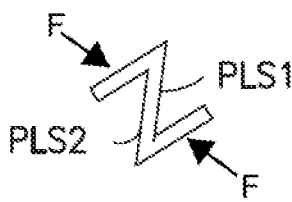
Figure 9J:
Figure 9K:
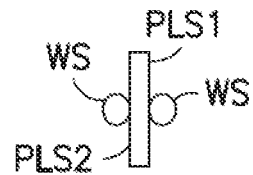

In the aspects of the disclosed embodiment described above, the integrally formed section of increased lateral thickness/cross section 350IS and plate segments 603, 703, 803 are illustrated as having a substantially rectangular cross section. However, in other aspects the plate segments and/or integrally formed section of increased lateral thickness/cross section (referred to collectively as plate section(s) for explanatory purposes) may have any suitable cross section such as those described in FIGS. 9A-9H. For example, FIG. 9A illustrates a plate section having a "T" (or upside down "T") shaped cross section with lateral sides PLS1, PLS2 to which a monolithic band or pulley interface segments can be affixed or integrally formed therewith. FIG. 9B illustrates a plate section having an "I" shaped cross section with lateral sides PLS1, PLS2 to which a monolithic band or pulley interface segments can be affixed or integrally formed therewith. FIG. 9C illustrates a plate section having a "C" (or reversed "C") shaped cross section with lateral sides PLS1, PLS2 to which a monolithic band or pulley interface segments can be affixed or integrally formed therewith. FIG. 9D illustrates a plate section having a "L" (or upside down "L") shaped cross section with lateral sides PLS1, PLS2 to which a monolithic band or pulley interface segments can be affixed or integrally formed therewith. FIG. 9E illustrates a plate section having a hollowed out rectangular shaped cross section (e.g. a rectangular tube) with lateral sides PLS1, PLS2 to which a monolithic band or pulley interface segments can be affixed or integrally formed therewith. FIG. 9F illustrates a plate section having a triangular shaped cross section with a lateral side PLS1 to which a monolithic band or pulley interface segments can be affixed or integrally formed therewith. FIG. 9G illustrates a plate section having a hollowed out rectangular shaped cross section (e.g. a triangular tube) with a lateral side PLS1 to which a monolithic band or pulley interface segments can be affixed or integrally formed therewith. FIG. 9H illustrates a plate section having a sideways "T" shaped cross section with a lateral side PLS1 to which a monolithic band or pulley interface segments can be affixed or integrally formed therewith. FIG. 9I illustrates a plate section having a "Z" shaped cross section with lateral sides PLS1, PLS2 to which a monolithic band or pulley interface segments can be affixed or integrally formed therewith. As may be realized, one or more of the plate segments illustrated in FIGS. 9A-9I may be integrally formed with (as a unitary one piece structure), bonded to or otherwise affixed to one or more lateral sides LS1, LS2 of the pulley interface sections of the torque transmission band 350, 600, 700, 800 described above. FIGS. 9J and 9K illustrate one or more wire segments WS, similar to the plate segments described above, that can be affixed (e.g. in any suitable manner such as mechanically and/or chemically, e.g. bonded, welded, crimped, etc.) to one or more lateral sides PLS1, PLS2 of a monolithic band or pulley interface segments, such as those described above, to form a band doubler. It is noted that while one wire segment WS is illustrated on each lateral side, in other aspects more than one wire segment may be affixed to each lateral side.

Referring again to FIG. 5, the plate segments described herein may include one or more web or other suitably shaped portions 550, 551 for reducing stress concentrations in the band. For example, the ends of the plate sections that are affixed to the monolithic band or pulley interface sections may have a tapering, filleted or other suitably shaped end 550, 551 at the transitions between the plate section and the monolithic band or pulley interface sections. In other aspects stress concentrations in the band and/or plate sections may be reduced in any suitable manner.

Figure 10:
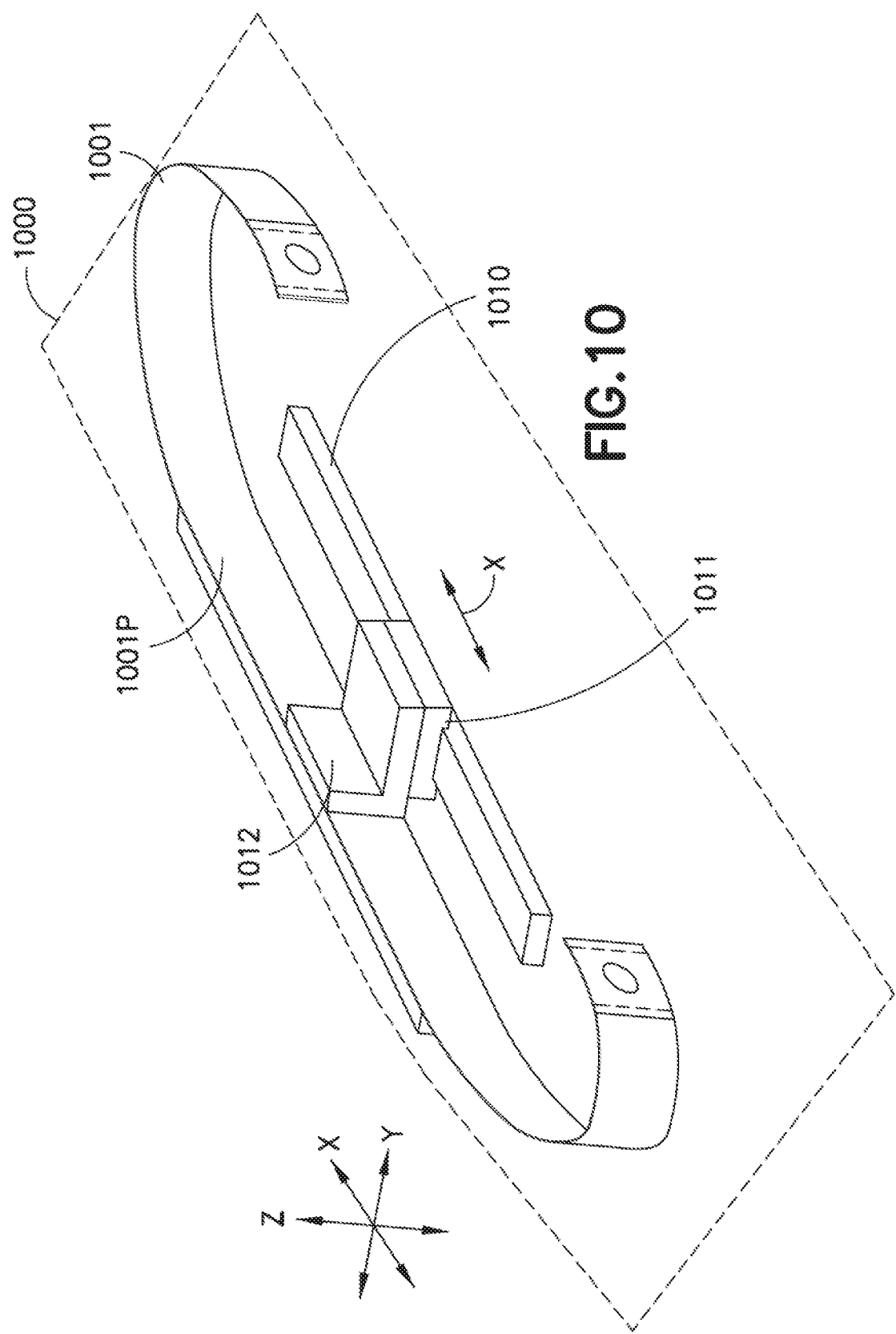
FIG. 10 is a schematic illustration of a portion of a robotic transport arm in accordance with aspects of the disclosed embodiment.

Referring to FIG. 10, to further increase the stiffness of the band the plate section may be connected to any suitable guide configured to restrict and guide the movement of the band. For example, FIG. 10 illustrates an exemplary arm link in which torque transmission band 1001 is located. The torque transmission band 1001 may be substantially similar to those described above (it is noted that the pulleys which interface with the band 1001 are omitted for clarity). A linear guide rail 1010 may be disposed within the transport arm link 1000. A movable carriage 1011 may be configured to interface with and ride along the guide rail 1010 such that the carriage 1011 is substantially restricted to movement along the longitudinal axis (e.g. the X direction) of the transport arm link 1000. A coupling member 1012 may couple or otherwise connect, for example, the plate section 1001P of the band 1001 to the carriage 1011 such that the plate section 1001P of the band 1001 is also substantially restricted to movement in the X direction. In other aspects any suitable guide configuration may be provided for substantially restricting the movement of the plate section 1001P to movement in the X direction.

In accordance with one or more aspects of the disclosed embodiment a substrate processing apparatus includes a transport arm having serially connected arm links, at least one of the arm links having a predetermined arm link height; at least a first pulley and a second pulley, where the second pulley is fixed to an arm link of the serially connected arm links; and at least one torque transmission band extending longitudinally between and coupled to each of the first pulley and the second pulley, the at least one torque transmission band having a corresponding band height for the predetermined arm link height and a variable lateral thickness such that the at least one torque transmission band includes a segment of laterally increased cross section for the corresponding band height.

In accordance with one or more aspects of the disclosed embodiment the substrate processing apparatus includes a drive section drivingly connected to the first pulley for effecting extension and retraction of the serially connected arm links.

In accordance with one or more aspects of the disclosed embodiment the first pulley is a drive pulley and the second pulley is a driven pulley.

In accordance with one or more aspects of the disclosed embodiment the segment of laterally increased cross section is a non-flexing band segment.

In accordance with one or more aspects of the disclosed embodiment the transport arm includes a first arm link having a proximate end coupled to a drive section; a second arm link being rotatably coupled, at a proximate end of the second arm link, to a distal end of the first arm link; and a substrate support connected to a distal end of the second arm link.

In accordance with one or more aspects of the disclosed embodiment the transport arm comprises a SCARA arm.

In accordance with one or more aspects of the disclosed embodiment each of the at least one torque transmission band includes a first and second pulley interface section having a first lateral cross section different than the laterally increased cross section; and the segment of laterally increased cross section joins the first pulley interface section to the second pulley interface section.

In accordance with one or more aspects of the disclosed embodiment each of the at least one torque transmission band includes a first and second pulley interface section; and the segment of laterally increased cross section is disposed on the at least one torque transmission band between the first pulley interface section and the second pulley interface section.

In accordance with one or more aspects of the disclosed embodiment the segment of laterally increased cross section is affixed to the at least one torque transmission band.

In accordance with one or more aspects of the disclosed embodiment the segment of laterally increased cross section has a unitary one piece construction with the at least one torque transmission band.

In accordance with one or more aspects of the disclosed embodiment the segment of laterally increased cross section comprises one or more flanges extending laterally from one or more lateral sides of the at least one torque transmission band.

In accordance with one or more aspects of the disclosed embodiment a substrate processing apparatus includes a transport arm having serially connected arm links, each of the arm links having a predetermined arm link height; at least a first pulley and a second pulley, where the second pulley is connected to a driven arm link of the serially connected arm links; and at least one torque transmission band extending longitudinally between and coupled to each of the first pulley and the second pulley, the at least one torque transmission band having a lateral band thickness and a predetermined height related to the predetermined arm link height, and a band segment coupled to at least one lateral side of the at least one torque transmission band, the band segment being configured to form a doubler member to change a thickness of the at least one torque transmission band over a predetermined length of the at least one torque transmission band.

In accordance with one or more aspects of the disclosed embodiment the substrate processing apparatus further includes a drive section drivingly connected to the first pulley for effecting extension and retraction of the arm links.

In accordance with one or more aspects of the disclosed embodiment, the first pulley is a drive pulley and the second pulley is a driven pulley.

In accordance with one or more aspects of the disclosed embodiment the band segment is a non-flexing band segment.

In accordance with one or more aspects of the disclosed embodiment the transport arm includes a first arm link having a proximate end coupled to the drive section; a second arm link being rotatably coupled, at a proximate end of the second arm link, to a distal end of the first arm link; and a substrate support connected to a distal end of the second arm link.

In accordance with one or more aspects of the disclosed embodiment the transport arm comprises a SCARA arm.

In accordance with one or more aspects of the disclosed embodiment the band segment is mechanically fixed to or chemically bonded to the at least one lateral side.

In accordance with one or more aspects of the disclosed embodiment the band segment comprises one or more flanges extending laterally from the at least one lateral side.

In accordance with one or more aspects of the disclosed embodiment the band segment comprises a first band segment disposed on a first lateral side of the at least one torque transmission band and a second band second disposed on a second lateral side of the at least one torque transmission band, the second lateral side being opposite the first lateral side.

In accordance with one or more aspects of the disclosed embodiment a substrate transport apparatus includes a drive section; a SCARA arm having three or more arm links where at least one arm link has a predetermined arm link height; at least a first pulley and a second pulley, where the second pulley is fixed to an arm link of the serially connected arm links; and at least one torque transmission band extending longitudinally between and coupled to each of the first pulley and the second pulley, the at least one torque transmission band having a corresponding band height for the predetermined arm link height and a variable lateral thickness such that the at least one torque transmission band includes a segment of laterally increased cross section for the corresponding band height.

In accordance with one or more aspects of the disclosed embodiment, the at least one torque transmission band includes a band segment disposed on at least one lateral side of the at least one torque transmission band, the band segment being configured to change the cross section of the band segment over a predetermined length of the at least one torque transmission band for the predetermined height.

In accordance with one or more aspects of the disclosed embodiment the band segment is mechanically affixed to or chemically bonded to the at least one lateral side.

In accordance with one or more aspects of the disclosed embodiment the band segment comprises one or more flanges extending laterally from the at least one lateral side.

In accordance with one or more aspects of the disclosed embodiment a substrate processing apparatus includes a transport arm having serially connected arm links, at least one of the arm links having a predetermined arm link height; at least a first pulley and a second pulley, where the second pulley is connected to an arm link of the serially connected arm links; and at least one torque transmission band extending longitudinally between and coupled to each of the first pulley and the second pulley, the at least one torque transmission band having a corresponding band height for the predetermined arm link height, a first band portion extending longitudinally between the first and second pulleys and a second band portion extending longitudinally between the first and second pulleys where a thickness of the second band portion is greater than a thickness of the first band portion.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A substrate processing apparatus comprising:
   a transport arm having serially connected arm links, at least one of the arm links having a predetermined arm link height;
   at least a first pulley and a second pulley, where the second pulley is fixed to an arm link of the serially connected arm links; and
   a multiband torque transmission with more than one independent unidirectional torque transmission band each of which extends longitudinally continuously between and independently coupled to each of the first pulley and the second pulley so that each torque load transmission, between the first pulley and the second pulley, by each of the more than one independent unidirectional torque transmission band between the first pulley and the second pulley imparts, under torque load, a tension load throughout a respective one of the more than one independent unidirectional torque transmission band substantially continuously throughout a whole span length of the respective one of the more than one independent unidirectional torque transmission band extending in whole from the first pulley to the second pulley, each of the more than one independent unidirectional torque transmission band having a corresponding band height for the predetermined arm link height and a variable lateral thickness such that each of the more than one independent unidirectional torque transmission band includes a segment of laterally increased cross section for the corresponding band height, the segment of laterally increased cross section being distinct from and disposed between end couplings located at a respective terminus of the respective one of the more than one independent unidirectional torque transmission band coupling opposite ends of the respective one of the more than one independent unidirectional torque transmission band respectively to each of the first pulley and the second pulley.

2. The substrate processing apparatus of claim 1, further comprising a drive section drivingly connected to the first pulley for effecting extension and retraction of the serially connected arm links.

3. The substrate processing apparatus of claim 1, wherein the first pulley is a drive pulley and the second pulley is a driven pulley.

4. The substrate processing apparatus of claim 1, wherein the segment of laterally increased cross section is a non-flexing band segment.

5. The substrate processing apparatus of claim 1, wherein the transport arm includes:
   a first arm link having a proximate end coupled to a drive section;
   a second arm link being rotatably coupled, at a proximate end of the second arm link, to a distal end of the first arm link; and
   a substrate support connected to a distal end of the second arm link.

6. The substrate processing apparatus of claim 1, wherein the transport arm comprises a SCARA arm.

7. The substrate processing apparatus of claim 1, wherein each of the more than one independent unidirectional torque transmission band includes a first and second pulley interface section having a first lateral cross section different than the laterally increased cross section, and the segment of laterally increased cross section joins the first pulley interface section to the second pulley interface section.

8. The substrate processing apparatus of claim 1, wherein each of the more than one independent unidirectional torque transmission band includes a first and second pulley interface section, and the segment of laterally increased cross section is disposed on the at least one torque transmission band between the first pulley interface section and the second pulley interface section.

9. The substrate processing apparatus of claim 1, wherein the segment of laterally increased cross section is affixed to the respective one of the more than one independent unidirectional torque transmission band.

10. The substrate processing apparatus of claim 1, wherein the segment of laterally increased cross section has a unitary one piece construction with the respective one of the more than one independent unidirectional torque transmission band.

11. The substrate processing apparatus of claim 1, wherein the segment of laterally increased cross section comprises one or more flanges, with ends that define the laterally increased cross section, protruding laterally from one or more lateral sides of the respective one of the more than one independent unidirectional torque transmission band and extending longitudinally along the one or more lateral sides of the respective one of the more than one independent unidirectional torque transmission band.

12. A substrate processing apparatus comprising:
a transport arm having serially connected arm links, each of the arm links having a predetermined arm link height;
at least a first pulley and a second pulley, where the second pulley is connected to a driven arm link of the serially connected arm links; and
a multiband torque transmission with more than one independent unidirectional torque transmission band each of which extends longitudinally continuously between and independently coupled to each of the first pulley and the second pulley so that each torque load transmission, between the first pulley and the second pulley, by each of the more than one independent unidirectional torque transmission band between the first pulley and the second pulley imparts, under torque load, a uniaxial tension load throughout a respective one of the more than one independent unidirectional torque transmission band substantially continuously throughout a whole span length of the respective one of the more than one independent unidirectional torque transmission band extending in whole from the first pulley to the second pulley, each of the more than one independent unidirectional torque transmission band having a lateral band thickness and a predetermined height related to the predetermined arm link height, and a band segment coupled to at least one lateral side of the respective one of the more than one independent unidirectional torque transmission band, the band segment being configured to form a structural doubler member to change a thickness of the respective one of the more than one independent unidirectional torque transmission band over a predetermined length of the respective one of the more than one independent unidirectional torque transmission band, the doubler member being distinct from and disposed between end couplings located at a respective terminus of the respective one of the more than one independent unidirectional torque transmission band coupling opposite ends of the respective one of the more than one torque transmission band respectively to each of the first pulley and the second pulley.

13. The substrate processing apparatus of claim 12, further comprising a drive section drivingly connected to the first pulley for effecting extension and retraction of the arm links.

14. The substrate processing apparatus of claim 12, wherein the first pulley is a drive pulley and the second pulley is a driven pulley.

15. The substrate processing apparatus of claim 12, wherein the band segment is a non-flexing band segment.

16. The substrate processing apparatus of claim 12, wherein the transport arm includes:
a first arm link having a proximate end coupled to the drive section;
a second arm link being rotatably coupled, at a proximate end of the second arm link, to a distal end of the first arm link; and
a substrate support connected to a distal end of the second arm link.

17. The substrate processing apparatus of claim 12, wherein the transport arm comprises a SCARA arm.

18. The substrate processing apparatus of claim 12, wherein the band segment is mechanically fixed to or chemically bonded to the at least one lateral side.

19. The substrate processing apparatus of claim 12, wherein the band segment comprises one or more flanges extending laterally from the at least one lateral side.

20. The substrate processing apparatus of claim 12, wherein the band segment comprises a first band segment disposed on a first lateral side of the respective one of the more than one independent unidirectional torque transmission band and a second band segment disposed on a second lateral side of the respective one of the more than one independent unidirectional torque transmission band, the second lateral side being opposite the first lateral side.

21. A substrate transport apparatus comprising:
a drive section;
a SCARA arm having three or more arm links where at least one arm link has a predetermined arm link height;
at least a first pulley and a second pulley, where the second pulley is fixed to an arm link of the serially connected arm links; and
a multiband torque transmission with more than one independent unidirectional torque transmission band each of which extends longitudinally continuously between and independently coupled to each of the first pulley and the second pulley so that each torque load transmission, between the first pulley and the second pulley, by each of the more than one independent unidirectional torque transmission band between the first pulley and the second pulley imparts, under torque load, a uniaxial tension load throughout a respective one of the more than one independent unidirectional torque transmission band substantially continuously throughout a whole span length of the respective one of the more than one independent unidirectional torque transmission band extending in whole from the first pulley to the second pulley, each of the more than one independent unidirectional torque transmission band having a corresponding band height for the predetermined arm link height and a variable lateral thickness such that each of the more than one independent unidirectional torque transmission band includes a segment of laterally increased cross section for the corresponding band height, the segment of laterally increased cross section being distinct from and disposed between end couplings located at a respective terminus of the respective one of the more than one independent unidirectional torque transmission band coupling opposite ends of the respective one of the more than one torque transmission band respectively to each of the first pulley and the second pulley.

22. The substrate transport apparatus of claim 21, wherein each of the more than one independent unidirectional torque transmission band includes a band segment disposed on at least one lateral side of the respective one of the more than one independent unidirectional torque transmission band, the band segment being configured to change the cross section of the band segment over a predetermined length of the respective one of the more than one independent unidirectional torque transmission band for the predetermined height.

23. The substrate transport apparatus of claim 22, wherein the band segment is mechanically affixed to or chemically bonded to the at least one lateral side.

24. The substrate transport apparatus of claim 22, wherein the band segment comprises one or more flanges extending laterally from the at least one lateral side.

25. A substrate processing apparatus comprising:
- a transport arm having serially connected arm links, at least one of the arm links having a predetermined arm link height;
- at least a first pulley and a second pulley, where the second pulley is connected to an arm link of the serially connected arm links; and
- a multiband torque transmission with more than one independent unidirectional torque transmission band each of which extends longitudinally continuously between and independently coupled to each of the first pulley and the second pulley so that each torque load transmission, between the first pulley and the second pulley, by each of the more than one independent unidirectional torque transmission band between the first pulley and the second pulley imparts, under torque load, a tension load throughout a respective one of the more than one independent unidirectional torque transmission band substantially continuously throughout a whole span length of the respective one of the more than one independent unidirectional torque transmission band extending in whole from the first pulley to the second pulley, each of the more than one independent unidirectional torque transmission band having a corresponding band height for the predetermined arm link height, a first band portion extending longitudinally between the first and second pulleys and a second band portion extending longitudinally between the first and second pulleys where a thickness of the second band portion is greater than a thickness of the first band portion, the second band portion being distinct from and disposed between end couplings located at a respective terminus of the respective one of the more than one independent unidirectional torque transmission band coupling opposite ends of the respective one of the more than one independent unidirectional torque transmission band respectively to each of the first pulley and the second pulley.

\* \* \* \* \*

UNITED STATES PATENT AND TRADEMARK OFFICE
CERTIFICATE OF CORRECTION

PATENT NO. : 11,201,073 B2
APPLICATION NO. : 14/469260
DATED : December 14, 2021
INVENTOR(S) : Gilchrist Page 1 of 1

It is certified that error appears in the above-identified patent and that said Letters Patent is hereby corrected as shown below:

In the Claims

Column 19, Claim 12, Line 42, after "a" delete "uniaxial"

Column 20, Claim 21, Line 51, after "a" delete "uniaxial"

Signed and Sealed this
Fifth Day of April, 2022

Drew Hirshfeld
*Performing the Functions and Duties of the*
*Under Secretary of Commerce for Intellectual Property and*
*Director of the United States Patent and Trademark Office*